(12) United States Patent
Sato

(10) Patent No.: US 9,929,200 B2
(45) Date of Patent: Mar. 27, 2018

(54) IMAGE PICKUP DEVICE, METHOD OF MANUFACTURING IMAGE PICKUP DEVICE, AND ELECTRONIC APPARATUS

(71) Applicant: Sony Corporation, Tokyo (JP)

(72) Inventor: Shinya Sato, Kumamoto (JP)

(73) Assignee: Sony Corporation, Tokyo (JP)

(*) Notice: Subject to any disclaimer, the term of this patent is extended or adjusted under 35 U.S.C. 154(b) by 52 days.

(21) Appl. No.: 14/506,843

(22) Filed: Oct. 6, 2014

(65) Prior Publication Data

US 2015/0102448 A1 Apr. 16, 2015

(30) Foreign Application Priority Data

Oct. 11, 2013 (JP) .................................. 2013-213645

(51) Int. Cl.
 *H01L 27/146* (2006.01)
(52) U.S. Cl.
 CPC ...... *H01L 27/1463* (2013.01); *H01L 27/1464* (2013.01); *H01L 27/1469* (2013.01); *H01L 27/14634* (2013.01); *H01L 27/14641* (2013.01)
(58) Field of Classification Search
 CPC .................. H01L 27/1463; H01L 27/1464

USPC ........................................................... 257/46
See application file for complete search history.

(56) References Cited

U.S. PATENT DOCUMENTS

| 8,120,081 B2* | 2/2012 | Murakoshi .......... H01L 27/1463 257/228 |
| 2011/0127629 A1* | 6/2011 | Yorikado et al. .............. 257/432 |
| 2013/0285181 A1* | 10/2013 | Lin ..................... H01L 27/1463 257/432 |
| 2014/0015083 A1* | 1/2014 | Kao .............................. 257/432 |

FOREIGN PATENT DOCUMENTS

| JP | 2005-209677 A | 8/2005 |
| JP | 2010-109137 A | 5/2010 |

* cited by examiner

*Primary Examiner* — Bo Fan
(74) *Attorney, Agent, or Firm* — Sheridan Ross P.C.

(57) ABSTRACT

Provided is an image pickup device, including: a first trench provided between a plurality of pixels in a light-receiving region of a semiconductor substrate, the semiconductor substrate including the light-receiving region and a peripheral region, the light-receiving region being provided with the plurality of pixels each including a photoelectric conversion section; and a second trench provided in the peripheral region of the semiconductor substrate, wherein the semiconductor substrate has a variation in thickness between a portion where the first trench is provided and a portion where the second trench is provided.

20 Claims, 18 Drawing Sheets

IMAGE PICKUP DEVICE, METHOD OF MANUFACTURING IMAGE PICKUP DEVICE, AND ELECTRONIC APPARATUS

CROSS REFERENCE TO RELATED APPLICATIONS

This application claims the benefit of Japanese Priority Patent Application JP 2013-213645 filed on Oct. 11, 2013, the entire contents of which are incorporated herein by reference.

BACKGROUND

The present disclosure relates to an image pickup device of a backside illumination type, to a manufacturing method thereof, and to an electronic apparatus.

In a solid-state image pickup device (an image pickup device) such as a CCD (Charge Coupled Device) image sensor or a CMOS (Complementary Metal Oxide Semiconductor) image sensor, a solid-state image pickup element (an image pickup element) including a photoelectric conversion section (for example, a PD (Photo Diode) is arranged for each pixel.

In the image pickup device, when intense light enters some pixels in an imaging screen to allow signal charges to be produced in an amount exceeding charge accommodation ability of a photodiode, the excessive signal charges overflow out of a potential well configured by the photodiode to leak into neighboring photodiodes, which contributes to serious degradation in image quality. The signal charge leak may be prevented, for example, by providing a trench between adjacent pixels in a Si substrate in which the photodiode is embedded, and by covering a surface of the trench with an insulating film having a negative fixed charge.

On the other hand, most image pickup devices have a configuration in which incident light is allowed to enter on the wiring layer side (a front side illumination image pickup device). Disadvantages in such image pickup devices involve lowered sensitivity caused by the incident light shielded by the wiring layer, and occurrence of color mixing caused by the incident light reflected by the wiring layer to enter an adjacent pixel. Accordingly, a backside illumination image pickup device is proposed. In the backside illumination image pickup device, photodiodes and various transistors are provided on a front surface of a Si substrate, and a rear surface of the Si substrate is polished for thinning to allow incident light to enter on the rear surface side for photoelectric conversion (for example, Japanese Unexamined Patent Application Publication No. 2005-209677).

In the backside illumination image pickup device, an external connection electrode on the same layer as the wiring layer is provided on the opposite side (the front surface) to the light-incident surface (the rear surface) of the Si substrate. Therefore, the external connection electrode is exposed as an electrode pad inside a hole with a depth enough to penetrate the Si substrate. The external connection electrode thus exposed is connected to an external circuit, for example, by wire bonding. At this time, an end of a capillary is likely to come into contact with an edge of the hole, which may cause a leak. To cope therewith, proposed is an image pickup device provided with an insulating film around the hole to insulate the external connection electrode from the Si substrate (for example, Japanese Unexamined Patent Application Publication No. 2010-109137).

SUMMARY

The above-mentioned trench to divide pixels (a pixel division trench) and a trench to provide the insulating film that insulates the external connection electrode from the Si substrate (an insulation division trench) both extend in a direction of depth of the Si substrate. It is therefore possible to form the trenches in the same process, which makes it possible to reduce the number of manufacturing processes. However, in a case that the pixel division trench is formed simultaneously with the insulation division trench that penetrates the Si substrate, there is a disadvantage of a possibility of damage to an FD (floating diffusion) provided between pixels on the front surface of the Si substrate.

On the other hand, in a case that the pixel division trench is formed separately from the insulation division trench, when an insulation material is embedded in the trench, since the trench is deep, it takes a long time until the insulation division trench is fully filled with the insulation material. This causes the insulation material to be deposited on the Si substrate as a thick film. Consequently, color mixing is liable to occur due to obliquely incident light, which arises a disadvantage of lowered focusing characteristics.

It is desired to provide an image pickup device that makes it possible to reduce the number of processes while maintaining focusing characteristics, a manufacturing method thereof, and an electronic apparatus.

According to an embodiment of the present disclosure, there is provided an image pickup device including: a first trench provided between a plurality of pixels in a light-receiving region of a semiconductor substrate, the semiconductor substrate including the light-receiving region and a peripheral region, the light-receiving region being provided with the plurality of pixels each including a photoelectric conversion section; and a second trench provided in the peripheral region of the semiconductor substrate, wherein the semiconductor substrate has a variation in thickness between a portion where the first trench is provided and a portion where the second trench is provided.

According to an embodiment of the present disclosure, there is provided a method of manufacturing an image pickup device including: providing a dug portion in a peripheral region in one surface of a semiconductor substrate, the semiconductor substrate including a light-receiving region and the peripheral region, the light-receiving region being provided with a plurality of pixels each including a photoelectric conversion section; and providing a first trench and a second trench in another surface of the semiconductor substrate, the first trench being provided in the light-receiving region, the second trench being provided at a position of the peripheral region, the position facing the dug portion.

According to an embodiment of the present disclosure, there is provided an electronic apparatus provided with an image pickup device. The image pickup device includes: a first trench provided between a plurality of pixels in a light-receiving region of a semiconductor substrate, the semiconductor substrate including the light-receiving region and a peripheral region, the light-receiving region being provided with the plurality of pixels each including a photoelectric conversion section; and a second trench provided in the peripheral region of the semiconductor substrate, wherein the semiconductor substrate has a variation in thickness between a portion where the first trench is provided and a portion where the second trench is provided.

In the image pickup device, the manufacturing method thereof, and the electronic apparatus according to the above-described embodiments of the present disclosure, the first trench (the pixel division trench) is provided between pixels in the light-receiving region, and the second trench (the insulating division trench) is provided in the peripheral region. The first trench and the second trench are formed, after etching the peripheral region on one surface of the semiconductor substrate, from the other surface. This makes it possible to form each of the first trench and the second trench in desired shapes in the same process and under the same conditions.

According to the image pickup device, the manufacturing method thereof, and the electronic apparatus in the above-described embodiments of the present disclosure, the first trench is provided between pixels in the light-receiving region, and the second trench is provided in the peripheral region. The first trench and the second trench are formed, after etching the peripheral region on one surface of the semiconductor substrate, from the other surface. Thereby, the first trench and the second trench are formed in desired shapes in the same process and under the same conditions. Specifically, it is possible to form the first trench that does not penetrate the semiconductor substrate and the second trench that penetrates the semiconductor substrate in the same process. Hence, it is possible to reduce the number of processes without lowering focusing characteristics. It is to be noted that the effects described herein are not necessarily limitative, and any of other effects described in this disclosure may be shown.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, some embodiments of the present disclosure will be described in detail with reference to the accompanying drawings. It is to be noted that description will be made in the following order.

1. First Embodiment (an example in which a two-stage recess is provided in a peripheral region in a front surface of a semiconductor substrate)
   1-1. Basic Configuration
   1-2. Manufacturing Method
   1-3. Operations and Effects
2. Second Embodiment (an example in which recesses are provided in a peripheral region in a front surface and a rear surface of a semiconductor substrate)
3. Modification Example 1 (an example in which a fixed charge film is provided on a rear surface of a semiconductor substrate)
4. Modification Example 2 (an example in which a light-shielding film is extended in a trench)
5. Modification Example 3 (an example in which an air gap is provided in a trench)
6. Modification Example 4 (an example with a layered structure)
7. Application Example (an application to an electronic apparatus)

1. First Embodiment

Figure 1:
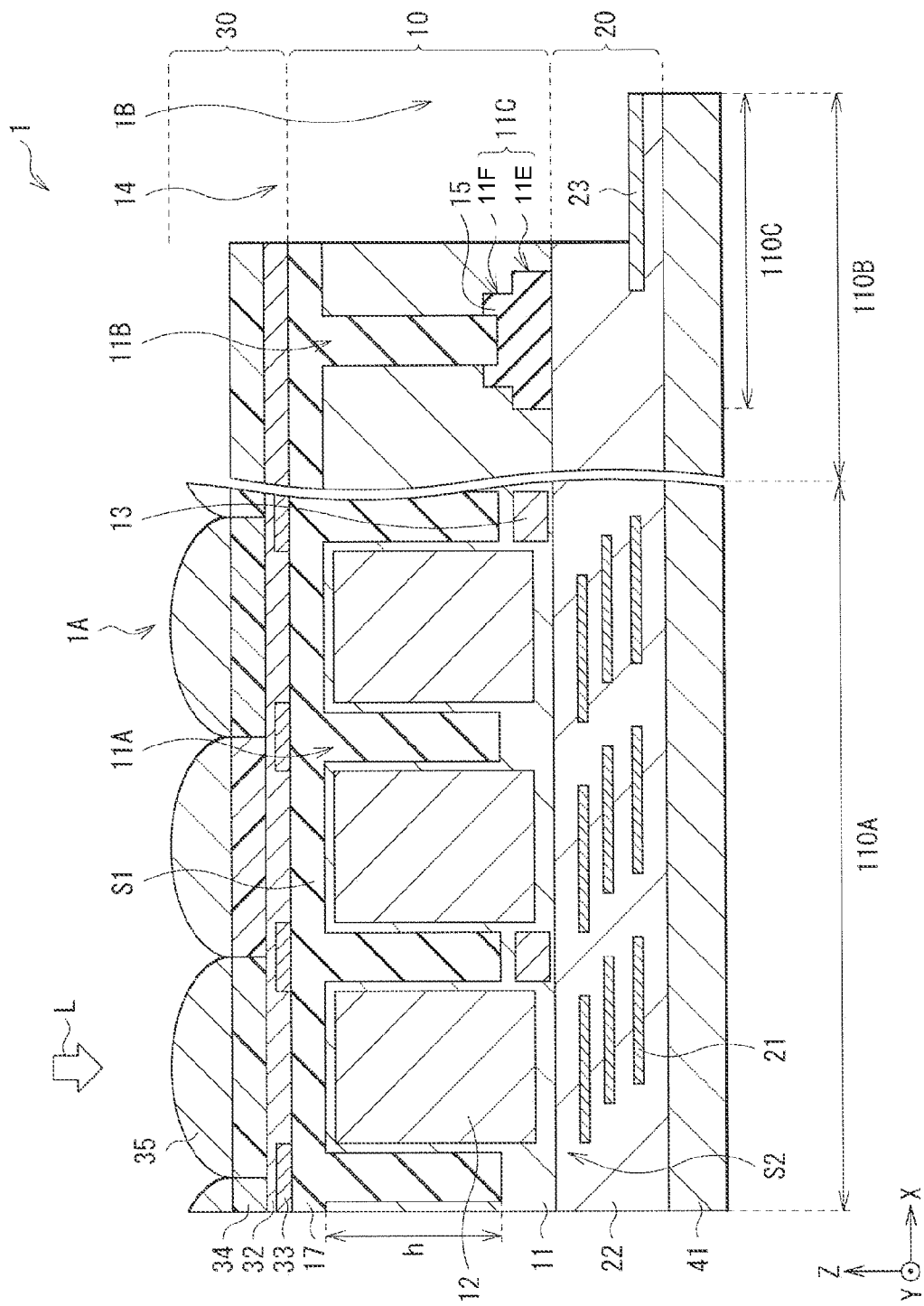
FIG. 1 is a cross-sectional view illustrating an image pickup device according to a first embodiment of the present disclosure.
Figure 2:
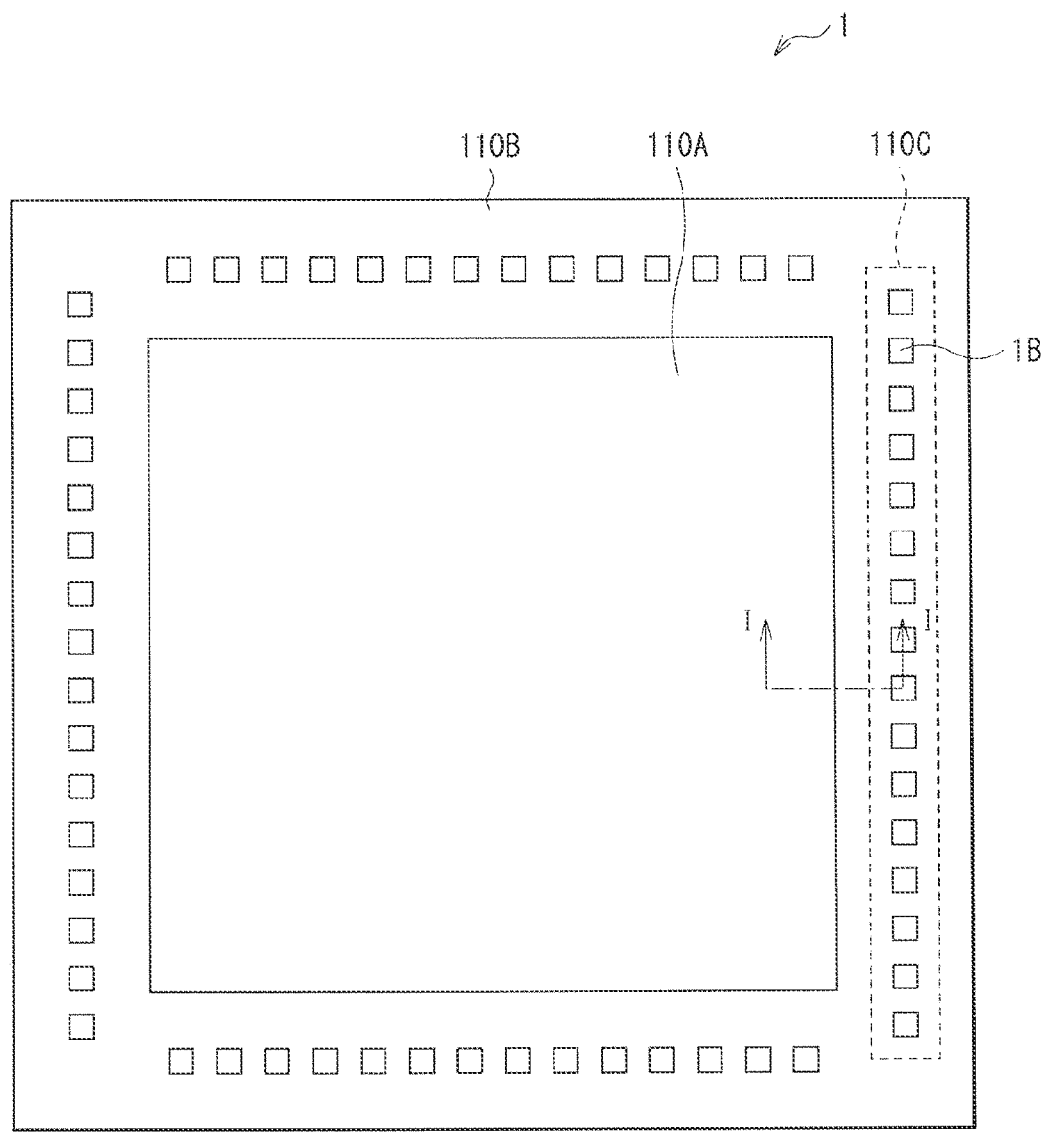
FIG. 2 is a plan view illustrating an overall configuration of the image pickup device illustrated in FIG. 1.

FIG. 1 illustrates in section (along I-I line in FIG. 2) a configuration of an image pickup device (an image pickup device 1) according to a first embodiment of the present disclosure. FIG. 2 illustrates an overall configuration of the image pickup device 1. The image pickup device 1 is used in, for example, a CCD image sensor or a CMOS image sensor and so forth, and is configured of a light-receiving region 110A including a plurality of pixels (for example, pixels P (refer to FIG. 7)) and a peripheral region 110B including a peripheral circuit (for example, a peripheral circuit section 130). The light-receiving region 110A has a configuration in which a plurality of pixels P are arranged in a two-dimensional array. Between the pixels, a pixel division trench 11A (a first trench) is provided. The peripheral region 110B includes an external connection region 110C as well as the peripheral circuit, and is provided with a plurality of external connection electrodes (electrode pads 1B). Around each of the electrode pads 1B, provided is an insulation division trench 11B (a second trench) that insulates the electrode pads 1B from a semiconductor substrate 11.

In the embodiment, a dug portion (a recess 11C) is provided at a position facing the insulation division trench 11B in a front surface (a surface S2) of the semiconductor substrate 11. An insulating film 15 is embedded in the recess 11C. A thickness of the semiconductor substrate 11 in a region where the insulation division trench 11B is provided is smaller than that in a region where the pixel division trench 11A is provided. Moreover, the pixel division trench 11A and the insulation division trench 11B are preferably formed in the same process and under the same conditions.

1-1. Basic Configuration

Figure 3A:
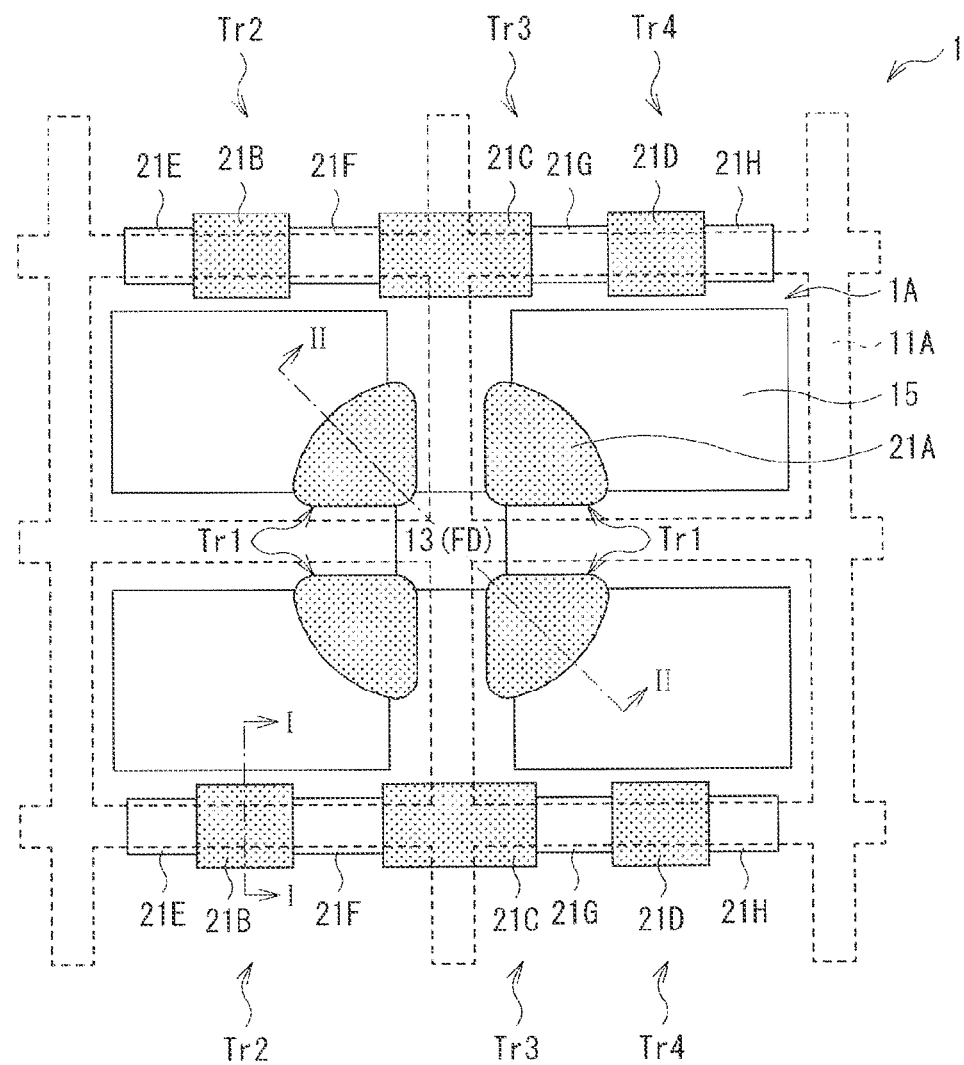
FIG. 3A is a plan view schematically illustrating a configuration of a pixel region of the image pickup device illustrated in FIG. 2.
Figure 3B:
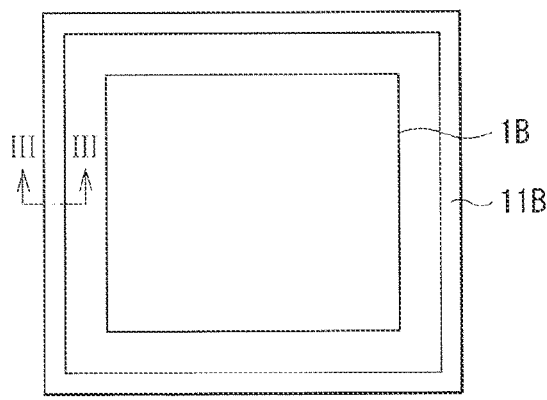
FIG. 3B is a plan view schematically illustrating a configuration of a pad section and its periphery illustrated in FIG. 2.

FIG. 3A illustrates a plan configuration of the light-receiving region 110A of the image pickup device 1 according to the embodiment. FIG. 3B illustrates a plan configuration of the electrode pad 1B and its periphery in the external connection region 110C of the peripheral region 110B. The image pickup device 1 according to the embodiment is a backside illumination image pickup device, and has a configuration of so-called four-pixel supply as a unit, in which four photoelectric conversion sections (PDs (photodiodes) 12) share desired pixel transistors.

As illustrated in FIG. 1, an image pickup element 1A includes a wiring layer 20 and a support substrate 41 on the front surface (the surface S2) side of the semiconductor substrate 11 that configures a light-receiving section 10. In the wiring layer 20, a plurality of wirings 21 are provided with an interlayer insulating film 22 in between. On a rear surface (a light-incident surface; a light-receiving surface S1) side, a focusing section 30 including an on-chip lens 35 and the forth is provided.

The light-receiving section 10 is configured of the semiconductor substrate 11 and a protective film 17. In the semiconductor substrate 11, for example, a PD 12 is embedded. The PD 12 has a function of converting incident light to electrons (photoelectric conversion function). The protective film 17 is provided on the rear surface of the semiconductor substrate 11.

The semiconductor substrate 11 is configured of, for example, p-type silicon (Si), and is provided with the pixel division trench 11A between the pixels P on the light-receiving surface S1 side. The pixel division trench 11A is extended in a direction (in a Z direction) of thickness of the semiconductor substrate 11. The pixel division trench 11A is provided, as illustrated in FIG. 3A, in a lattice shape to surround the pixel P. The pixel division trench 11A is arranged to overlap an FD (floating diffusion) 13 or source/drain regions 21E to 21H, which are described later. The pixel division trench 11A may have a depth (height (h)) sufficient to restrain a crosstalk, that is, preferably 0.25 um to 5 um both inclusive in a case that a thickness of the FD 13 or the source/drain regions 21E to 21H is equal to or less than 1 um. The pixel division trench 11A may have a width (W) sufficient to restrain a crosstalk, that is, 100 nm to 500 nm both inclusive.

Near the front surface (the surface S2) of the semiconductor substrate 11, a transfer transistor Tr1 (refer to FIGS. 3A and 8B) is provided. The transfer transistor Tr1 is configured to transfer signal charges produced in the PD 12 to a vertical signal line Lsig (refer to FIG. 7). A gate electrode TG1 of the transfer transistor Tr1 is included, for example, in the wiring layer 20. The signal charges may be either electrons or holes, which are produced by photoelectric conversion. Herein description is given on an exemplary case that electrons are read out as the signal charges.

Figure 4:
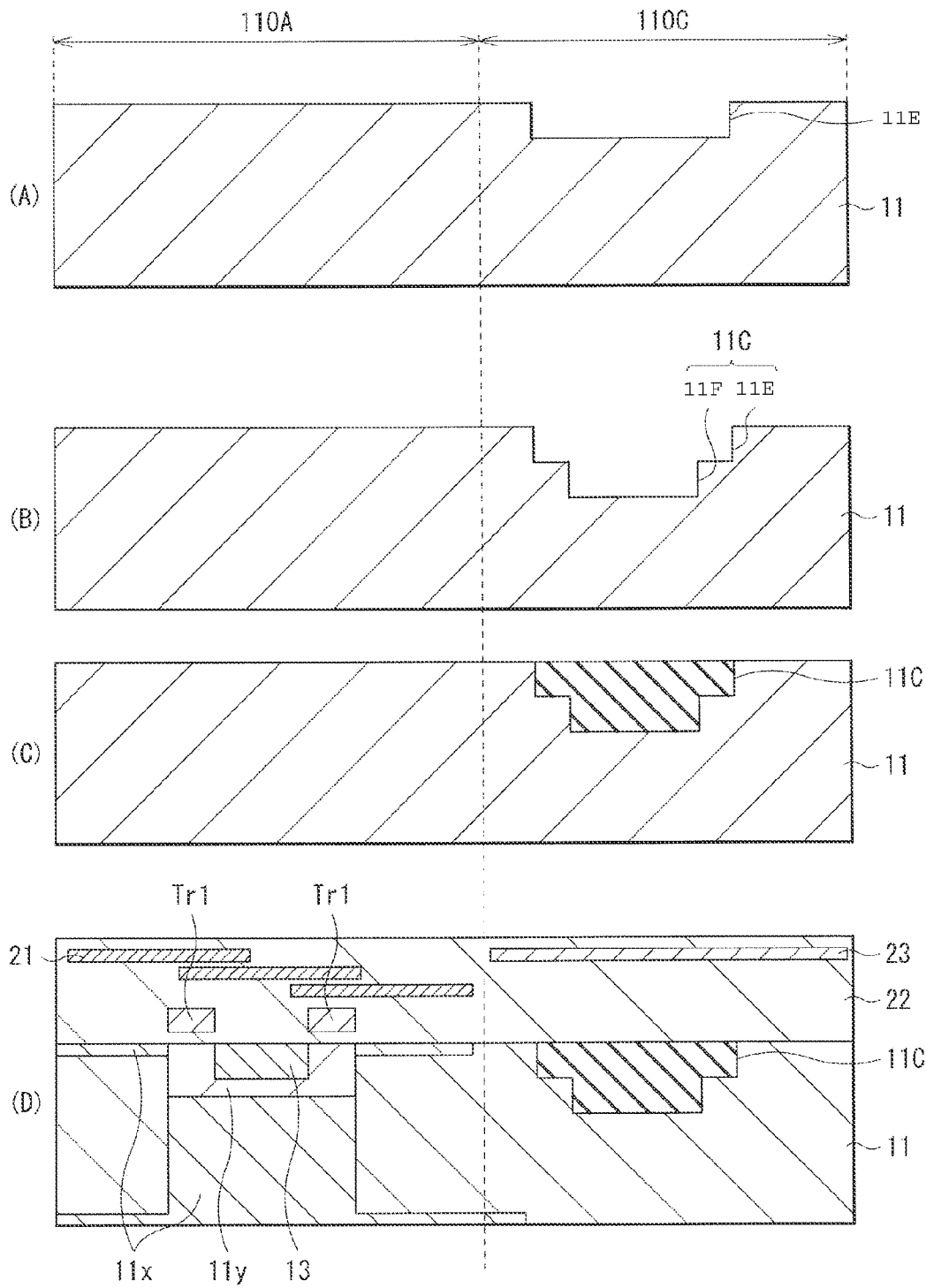
FIG. 4 is a cross-sectional view illustrating a method of manufacturing the image pickup device illustrated in FIG. 1.

Near the surface S2 of the semiconductor substrate 11, as well as the transfer transistor Tr1 as described above, for example, a reset transistor Tr2, an amplifier transistor Tr3, and a selection transistor Tr4 and so on are provided. The transistors are configured of, for example, MOSFETs (Metal Oxide Semiconductor Field Effect Transistors), and constitute a circuit for each of the pixels P. Each circuit may have, for example, a three-transistor configuration including the transfer transistor, the reset transistor, and the amplifier transistor. Alternatively, each circuit may have a four-transistor configuration with the selection transistor added. Transistors other than the transfer transistor may be shared by the pixels. Between four pixels (specifically, as illustrated in FIG. 3A, at a center region of the PDs 12 arrayed in two rows and two columns), the FD 13 is provided. The FD 13 is formed near the surface S2 of the semiconductor substrate 11. The FD 13 is an n-type semiconductor region formed by implantation of an n-type impurity in a high concentration into a p-well layer 11y (refer to (C) of FIG. 4) formed on the front surface side of the semiconductor substrate 11.

The PD 12 is, for example, an n-type semiconductor region that is formed for each of the pixels P in the direction (the Z direction) of thickness of the semiconductor substrate 11 (herein a Si substrate). The PD 12 is a photodiode having a p-n junction with p-type semiconductor regions provided near the front surface and the rear surface of the semiconductor substrate 11. It is to be noted that the semiconductor substrate 11 is provided with a p-type semiconductor region (a p-type layer 11X and the p-well layer 11y, for example, refer to (D) of FIG. 4) between the pixels P. It is to be noted that the pixel division trench 11A is formed in the p-type semiconductor region. A depth (in the Z direction) of the pixel division trench 11A is, for example, 0.25 um to 5 um both inclusive. It is not necessary for an end of the pixel division trench 11A to reach the p-well layer 11y formed around the FD 13, as long as the pixel division trench 11A is provided in the p-type semiconductor region. A sufficient inter-pixel insulation division effect may be obtained with the pixel division trench 11A provided in the p-type layer 11x.

The transfer transistor Tr1 is configured of the FD 13 and a transfer gate electrode 21A. The transfer gate electrode 21A is provided, as one of the wirings 21, in the wiring layer 20 near the surface S2 of the semiconductor substrate 11 between the PD 12 and the FD 13 with the interlayer insulating film 22 in between.

Among the pixel transistors, the reset transistor Tr2, the amplifier transistor Tr3, and the selection transistor Tr4 are formed for each four PDs 12 that share the FD 13. The pixel transistors are located, as illustrated in FIG. 3A, on one side of a group that is constituted by the four PDs 12.

The reset transistor Tr2 is configured of a pair of source/drain regions 21E and 21F, and a reset gate electrode 21B formed between the source/drain regions 21E and 21F. The amplifier transistor Tr3 is configured of a pair of source/drain regions 21F and 21G, and an amplifier gate electrode 21C formed between the source/drain regions 21F and 21G The selection transistor Tr4 is configured of a pair of source/drain regions 21G and 21H, and a selection gate electrode 21D formed between the source/drain regions 21G and 21H.

The reset transistor Tr2, the amplifier transistor Tr3, and the selection transistor Tr4 each has a configuration similar to that of the transfer transistor Tr1. In other words, the source/drain regions 21E to 21H are configured of, similar to the FD 13, an n-type high-concentration impurity region formed in the p-well layer 11y of the semiconductor substrate 11.

The protective film 17 fills in the pixel division trench 11A, and planarizes the light-receiving surface S1 of the semiconductor substrate 11. The protective film 17 is configured of, for example, a single-layer film or a layered film of silicon nitride ($Si_2N_3$), silicon oxide ($SiO_2$), silicon oxynitride (SiON) and so on. A thickness of the protective film 17 is preferably, for example, 0.05 um to 0.30 um both inclusive.

The focusing section 30 is provided on the light-receiving surface S1 side of the light-receiving section 10, and includes the on-chip lens 35 as an optical function layer on the light-incident side. The on-chip lens 35 is arranged to face the PD 12 of each of the pixels P. Between the light-receiving section 10 (specifically, the protective film 17) and the on-chip lens 35, a planarization film 32 and a color filter 34 are laminated in this order from the light-receiving section 10 side. On the protective film 17 between the pixels P, a light-shielding film 33 is provided.

The on-chip lens 35 is configured to allow light to be focused toward the light-receiving section 10 (specifically, toward the PD 12 of the light-receiving section 10). A lens system of the on-chip lens 35 is set to a value according to a size of the pixel P, for example, 0.05 um to 1.00 um both inclusive. A refractive index of the on-chip lens 35 is, for example, 1.4 to 2.0 both inclusive. An example of a lens material includes an organic material, silicon oxide film ($SiO_2$), and so on.

The light-shielding film 33 is provided between the pixels P on the protective film 17, for example, at a position facing the pixel division trench 11A. The light-shielding film 33 is configured to restrain color mixing due to a crosstalk of obliquely incident light among adjacent pixels. An example of a material of the light-shielding film 33 includes, for example, tungsten (W), aluminum (Al), an alloy of Al and copper (Cu). A thickness thereof is, for example, 20 nm to 5000 nm both inclusive.

The planarization film 32 is configured of, for example, a single-layer film or a layered film of silicon nitride ($Si_2N_3$), silicon oxide ($SiO_2$), silicon oxynitride (SiON), and so on.

The color filter 34 is, for example, one of a red (R) filter, a green (G) filter, a blue (B) filter, and a white (W) filter. The color filter 34 is provided, for example, for each of the pixels P. The color filter 34 is arranged in a regular color array (for example, in a Bayer array). By providing the color filter 34, it is possible to obtain color light-receiving data corresponding to the color array.

The support substrate 41 is located on an opposite surface to the semiconductor substrate 11 side of the wiring layer 20. The support substrate 41 is provided for ensuring the strength of the semiconductor substrate 11 in the manufacturing process, and is configured of, for example, a silicon (Si) substrate.

Around the light-receiving region 110A, the peripheral region 110B is provided. The peripheral region 110B includes the external connection region 110C. In the external connection region 110C, the plurality of electrode pads 1B connected externally are provided. The electrode pad 1B has a configuration in which a wiring 23 is exposed inside a hole 14. The wiring 23 is provided on the same layer as the wiring 14 formed in the wiring layer 20. The hole 14 is provided on the wiring 23. Around the electrode pad 1B, as illustrated in FIG. 3B, the insulation division trench 11B is provided.

The insulation division trench 11B electrically insulates the electrode pad 1B from the semiconductor substrate 11, and is provided, similarly to the above-described pixel division trench 11A, from the rear surface (the light-receiving surface S1) side of the semiconductor substrate 11. In the embodiment, the recess 11C having differences in depth is provided at a position facing the insulation division trench 11B in the front surface (the surface S2) of the semiconductor substrate 11. The recess 11C is filled with an insulating film 15. The recess 11C may have a depth (in the Z direction) sufficient to divide the semiconductor substrate 11 by the recess 11C and by the insulation division trench 11B. This makes it possible to restrain a leak from the electrode pad 1B to the surrounding semiconductor substrate 11. It is to be noted that the recess 11C may have two or more differences in depth, or may be a simple dug structure without differences in depth. An aspect ratio of the recess 11C is preferably equal to or more than 0.5, to ensure embeddability of an insulating material constituting the insulating film 15 and to prevent misalignment with the insulating division trench 11B. Specifically, in a case that the depth of the insulation division trench 11B is 5 um, the depth of the recess 11C is equal to or more than 1 um, and the width is equal to or more than 0.5 um.

The image pickup device 1 may be, for example, manufactured as follows.

Manufacturing Method

First, two-stage etching is carried out on the surface S2 side of the semiconductor substrate 11 to form the recess 11C. Specifically, as illustrated in (A) of FIG. 4, in the external connection region 110C in the surface S2 of the semiconductor substrate 11, a recess 11E is formed, for example, by dry etching to the depth (h) of, for example, 300 nm. After that, as illustrated in (B) of FIG. 4, etching is carried out again inside the recess 11E to form a recess 11F to the depth (h) of, for example, 500 nm. Thus, the recess 11C is formed. Subsequently, as illustrated in (C) of FIG. 4, for example, SiN is embedded by PVD in the recess 11C to form the insulating film 15.

Next, on the surface S2 side of the semiconductor substrate 11, the wiring layer 20 is formed. Specifically, as illustrated in (D) of FIG. 4, for example, transistors such as the transfer transistor Tr1 and the peripheral circuit such as a logic circuit are formed near the surface S2 of the semiconductor substrate 11. For the semiconductor substrate 11, for example, a Si substrate is used. Subsequently, by ion implantation into the semiconductor substrate 11, impurity semiconductor regions (the n-type semiconductor region that constitutes the PD 12, the p-type layer 11x, and the p-well layer 11y) are formed. To be more specific, the n-type semiconductor region (the PD12) is formed at a position corresponding to each of the pixels P, while the p-type semiconductor region is formed between the pixels. Subsequently, as illustrated in (A) of FIG. 5, the support substrate 41 is bonded to the wiring layer 20.

Figure 5:
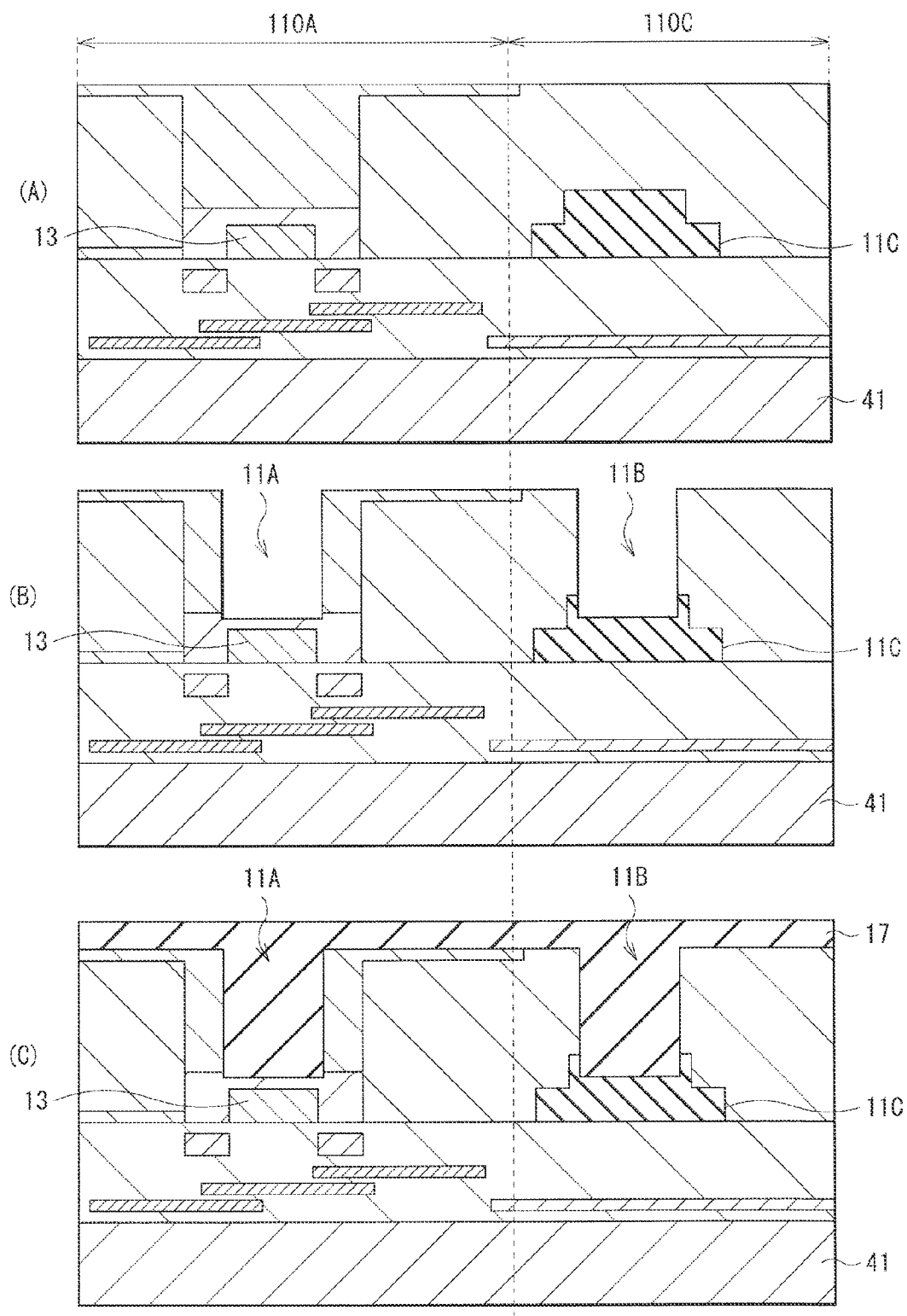
FIG. 5 is a cross-sectional view illustrating a process following FIG. 4.

After that, as illustrated in (B) of FIG. 5, the pixel division trench 11A and the insulation division trench 11B are formed, for example, by dry etching to the depth (h) of, for example, 3000 nm at a predetermined position in the light-receiving surface S1 of the semiconductor substrate 11, specifically in the p-type semiconductor region between the pixels P and in a region where the recess is formed in the external connection region 110C.

Figure 6:
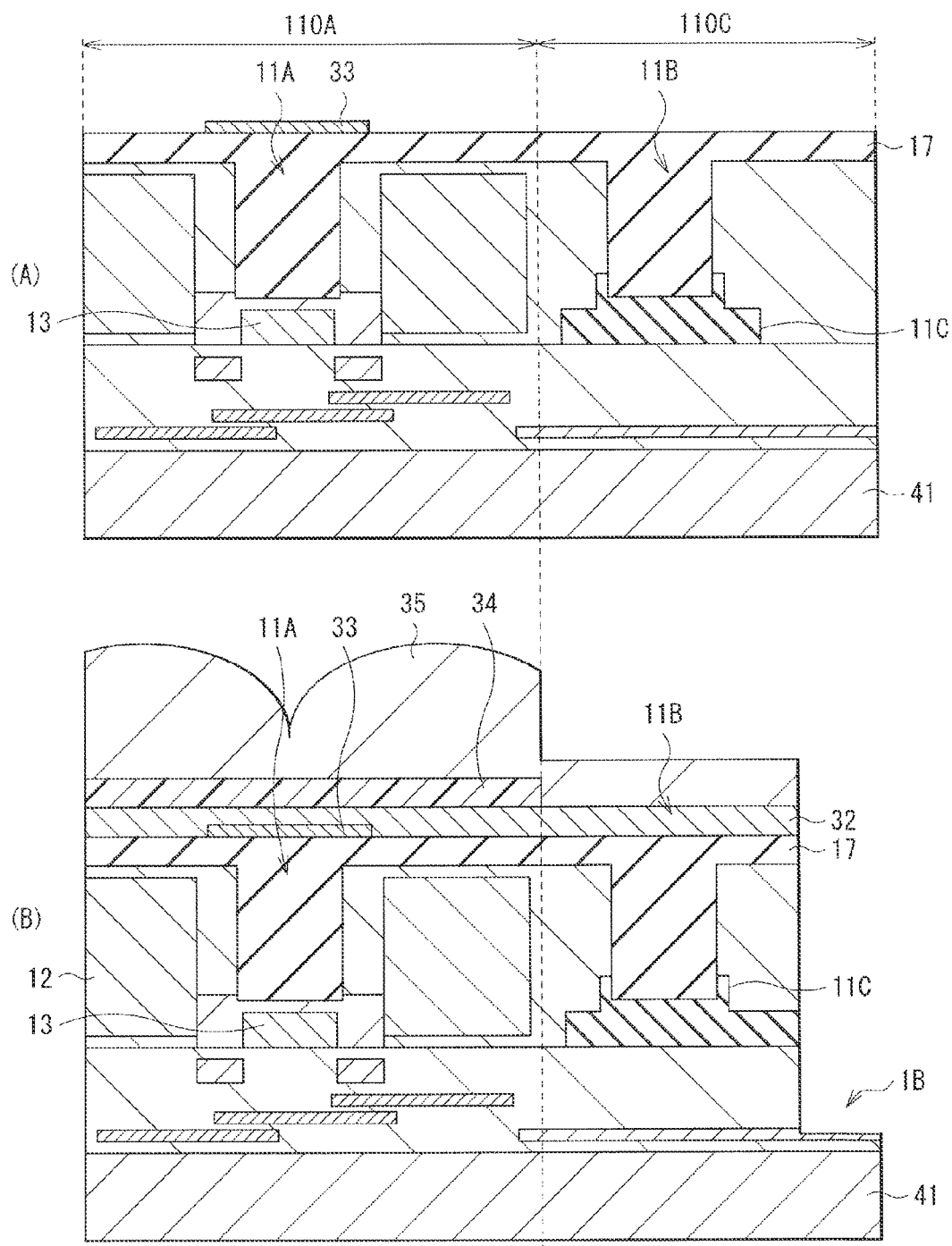
FIG. 6 is a cross-sectional view illustrating a process following FIG. 5.

Next, as illustrated in (C) of FIG. 5, for example a $SiO_2$ film is formed by CVD on the light-receiving surface S1 side of the semiconductor substrate 11 to form the protective film 17. In the meanwhile, the $SiO_2$ film is embedded in the pixel division trench 11A and the insulation division trench 11B. Subsequently, as illustrated in (A) of FIG. 6, on the protective film 17, the light-shielding film 33 is formed by a deposition process using, for example, sputtering or CVD and a patterning process using, for example, photolithography and so on. Next, as illustrated in (B) of FIG. 6, on the protective film 17 and the light-receiving film 33, the planarization film 32 is formed. After that, on the planarization film 32, the color filter 34 in a Bayer array and the on-chip lens 35 are formed in this order. Thus, the image pickup device 1 including the image pickup element 1A and the electrode pad 1B is completed.

Overall Configuration

Figure 7:
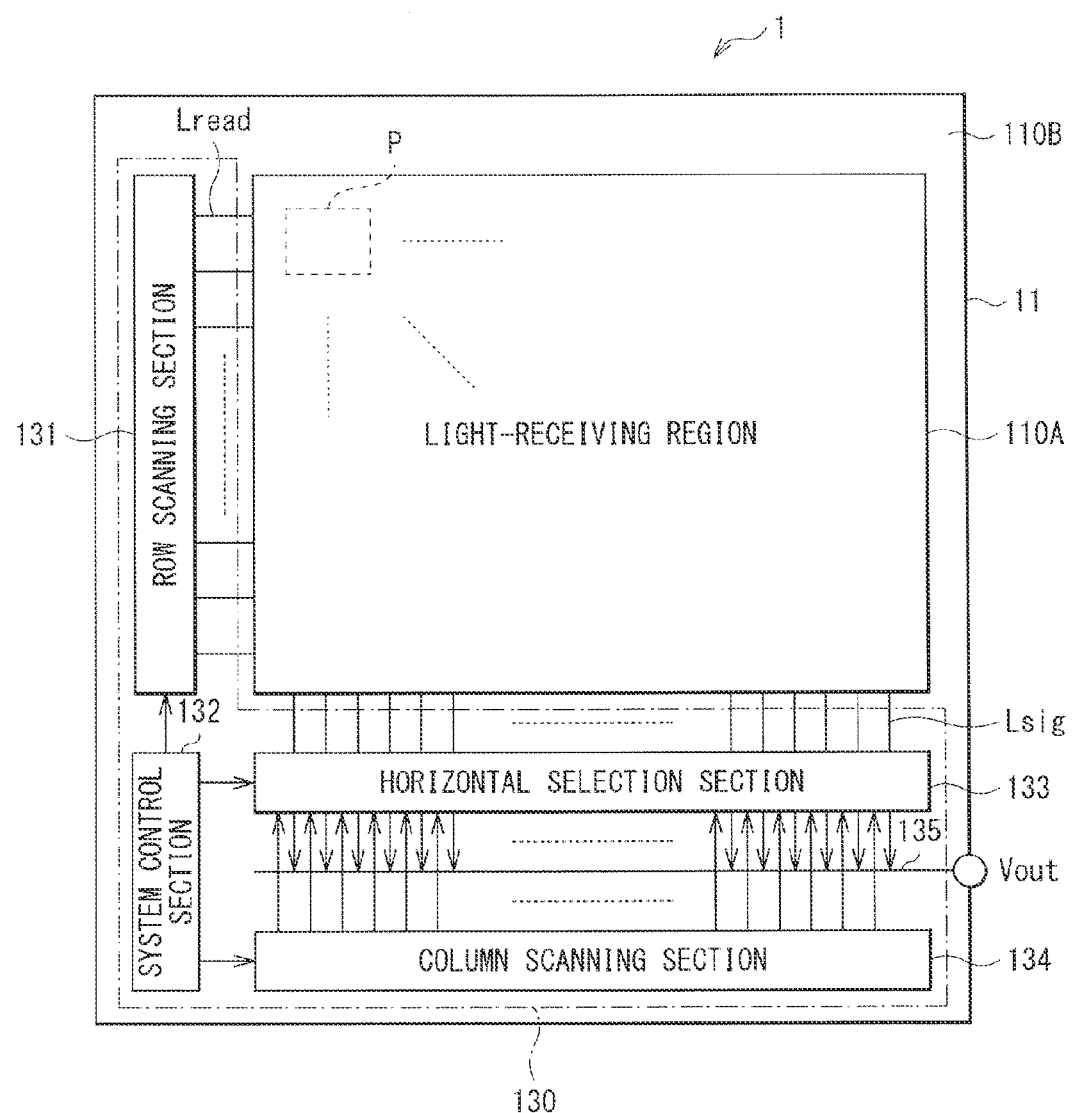
FIG. 7 is a functional block diagram of the image pickup device illustrated in FIG. 1.

FIG. 7 illustrates an overall configuration of the image pickup device 1 in a form of a block diagram. The image display device 1 constitutes, for example, a CMOS image sensor, and includes the light-receiving region 110A as an image pickup area in the center of the semiconductor substrate 11. In a periphery of the light-receiving region 110A, the peripheral circuit section 130 is provided. The peripheral circuit section 130 includes, for example, a row scanning section 131, a system control section 132, a horizontal selection section 133, and a column scanning section 134.

The light-receiving region 110A includes the plurality of unit pixels P (corresponding to the image pickup element 1A) that are two-dimensionally arranged in a matrix array. The unit pixels P are wired with pixel drive lines Lread (specifically a row selection line and a reset control line) for each pixel row, and with the vertical signal lines Lsig for each pixel column. The pixel drive lines Lread are configured to transfer drive signals for reading out signals from the pixels. Ends of the pixel drive lines Lread are connected to output terminals corresponding to each row of the row scanning section 131.

The row scanning section 131 is configured of a shift register and an address decoder and so on. The row scanning section 131 is a pixel drive section that is configured to drive each of the pixels P in the pixel region 1a, for example, in a unit of each row. A signal that is output from each of the pixels P in a pixel row selected by the row scanning section 131 is supplied to the horizontal selection section 133 through each of the vertical signal lines Lsig. The horizontal selection section 133 is configured of an amplifier and a horizontal selection switch and so on, which are provided for each of the vertical signal lines Lsig.

The column scanning section 134 is configured of a shift register and an address decoder and so on. The column scanning section 134 is configured to scan each of the horizontal selection switches of the horizontal selection section 133 and to drive them in order. By the selective scanning by the column scanning section 134, the signal that is produced in each of the pixels P and transferred through each of the vertical signal lines Lsig is output to the horizontal signal line 135 in order. Then the signal is transferred externally of the semiconductor substrate 11 through the horizontal signal line 135.

The circuit section that is configured of the row scanning section 131, the horizontal selection section 133, the column scanning section 134, and the horizontal signal line 135 may be provided directly on the semiconductor substrate 11, or on an external control IC. Alternatively, the circuit section may be provided on another substrate connected by a cable or the like.

The system control section 132 is configured to receive a clock supplied from externally of the semiconductor substrate 11 or data that instructs operation modes and so on, and is configured to output internal information of the image pickup device 1. In addition, the system control section 132 includes, for example, a timing generator that is configured to generate various kinds of timing signals. The system control section 132 is configured to perform drive control of the peripheral circuit such as the row scanning section 131, the horizontal selection section 133, and the column scanning section 134 based on the various kinds of timing signals generated in the timing generator.

Operations of Image Pickup Element

In the image pickup element 1A used as the pixel P in the image pickup device, signal charges (here, electrons) may be, for example, obtained as follows. Incident light L enters the light-receiving section 10 through the on-chip lens 35. The light L passes through the color filter 34 and so on to be detected (absorbed) by the PD 12 in each of the pixels P. Thus, color light in red, green, or blue is subject to photoelectric conversion. Among electron-hole pairs produced in the PD 12, electrons are moved to the semiconductor substrate 11 (for example, the n-type semiconductor region in a Si substrate) to be stored. Holes are moved to the p-type region to be discharged.

Operations and Functions

Figure 8A:
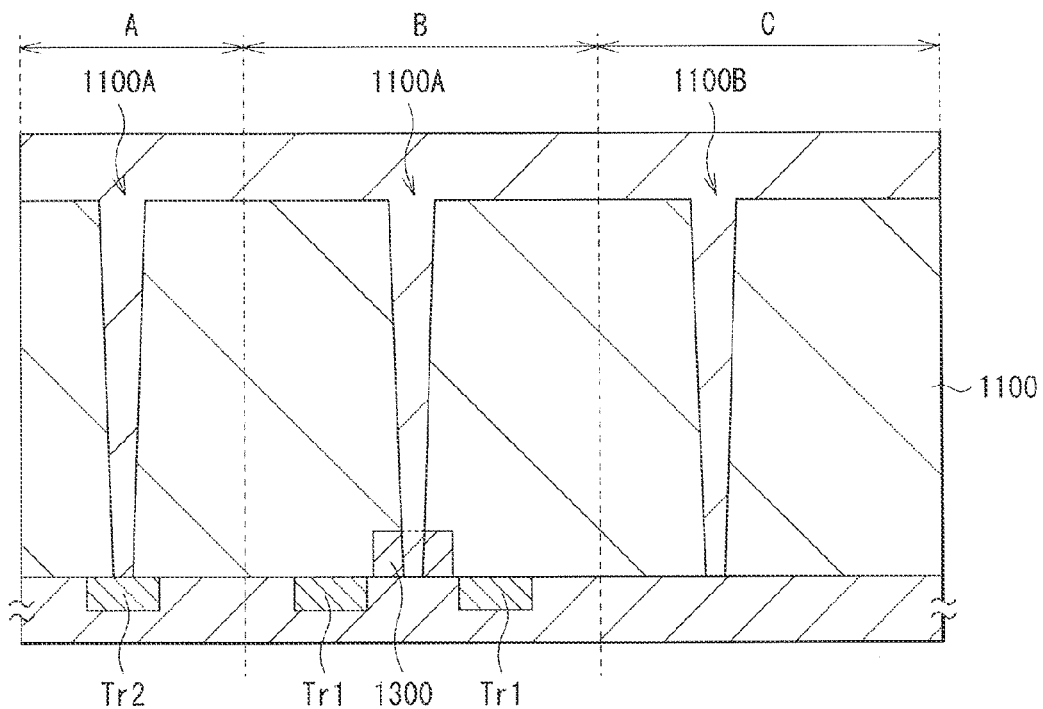
FIG. 8A is a cross-sectional view schematically illustrating an image pickup device according to a comparative example of the present disclosure.
Figure 8B:
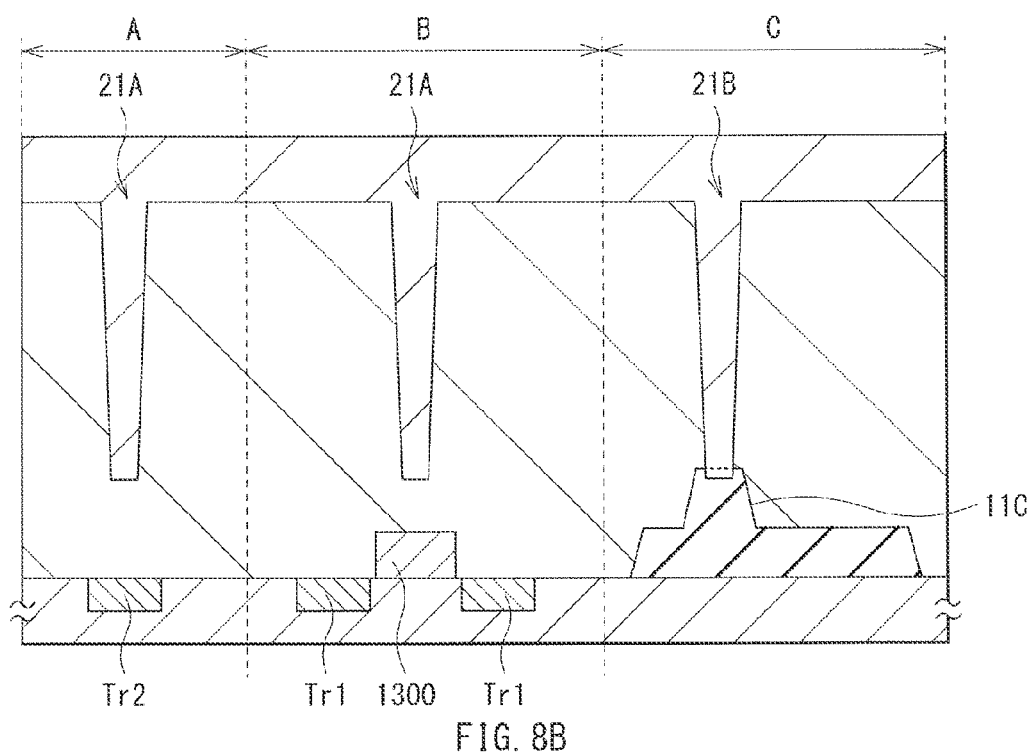
FIG. 8B is a cross-sectional view schematically illustrating the image pickup device illustrated in FIG. 1.

FIGS. 8A and 8B illustrate in section configurations of a pixel Tr section A (along the I-I line in the display device 1 illustrated in FIG. 3A), a TG section B (along the II-II line), and a pad section C (along the III-III line) according to a comparative example (FIG. 8A) and the embodiment example (FIG. 8B), respectively. The pixel division trench is provided between the pixels in the light-receiving region. The insulation division trench electrically insulates the electrode pads from the surrounding semiconductor substrate. The pixel division trench and the insulation division trench both belong to technology of forming an insulation division section in a direction of depth of the semiconductor substrate. It is therefore possible to reduce the number of manufacturing processes by forming them simultaneously. However, since the insulation division trench penetrates the semiconductor substrate, in a case of forming a pixel division trench 1100A on a basis of an insulation division trench 1100B, as illustrated in FIG. 8A, an end of the pixel division trench 1100A reaches a channel formation region of a reset transistor Tr2 or an FD 1300. This may cause a disadvantage of a difficulty in charge transfer and so on.

In the meanwhile, the pixel division trench 1100A and the insulation division trench 1100B may be formed separately in consideration of damage to the reset transistor Tr2 or the FD 1300. In this case, in embedding an insulating material in each trench, deposition time of the insulating material becomes longer, and an insulating film deposited on a rear surface of a semiconductor substrate 1100 is thickened. This may cause color mixing between pixels.

On the other hand, in the display device 1 according to the embodiment, as illustrated in FIG. 8B, the recess 11C is formed to the depth corresponding to the depth of the pixel division trench 11A on the front surface (the surface S2) side of the semiconductor substrate 11, the recess 11C facing the insulation division trench 11B. Specifically, in forming the insulation division trench 11B in the same process as the pixel division trench 11A and under the same conditions, the recess is formed to a depth enough for the insulation division trench 11B to penetrate the semiconductor substrate 11. Thus, it is possible to form the pixel division trench 11A and the insulation division trench 11B in the same process without lowering focusing characteristics.

As described above, in the embodiment, the recess 11C is formed on the opposite surface (the front surface, the surface S2) to the surface (the rear surface (the light-receiving surface S1) of the semiconductor substrate 11) on which the insulation division trench 11B is formed. The insulation trench 11B insulates the electrode pads 1B formed in the external connection region 110C of the peripheral region 110B. Thus, the semiconductor substrate 11 has a variation in thickness between a region where the pixel division trench 11A is provided and a region where the insulation division trench 11B is provided. Specifically, in the semiconductor substrate 11, the thickness of the region where the insulating division trench 11B is provided is smaller than the thickness of the region where the pixel division trench 11A is provided. It is therefore possible to form the pixel division trench 11A between the pixels in the light-receiving region 110A and the insulating division trench 11B in the same process and under the same conditions. In other words, it is possible to reduce the number of processes without lowering focusing characteristics.

2. Second Embodiment

Figure 9:
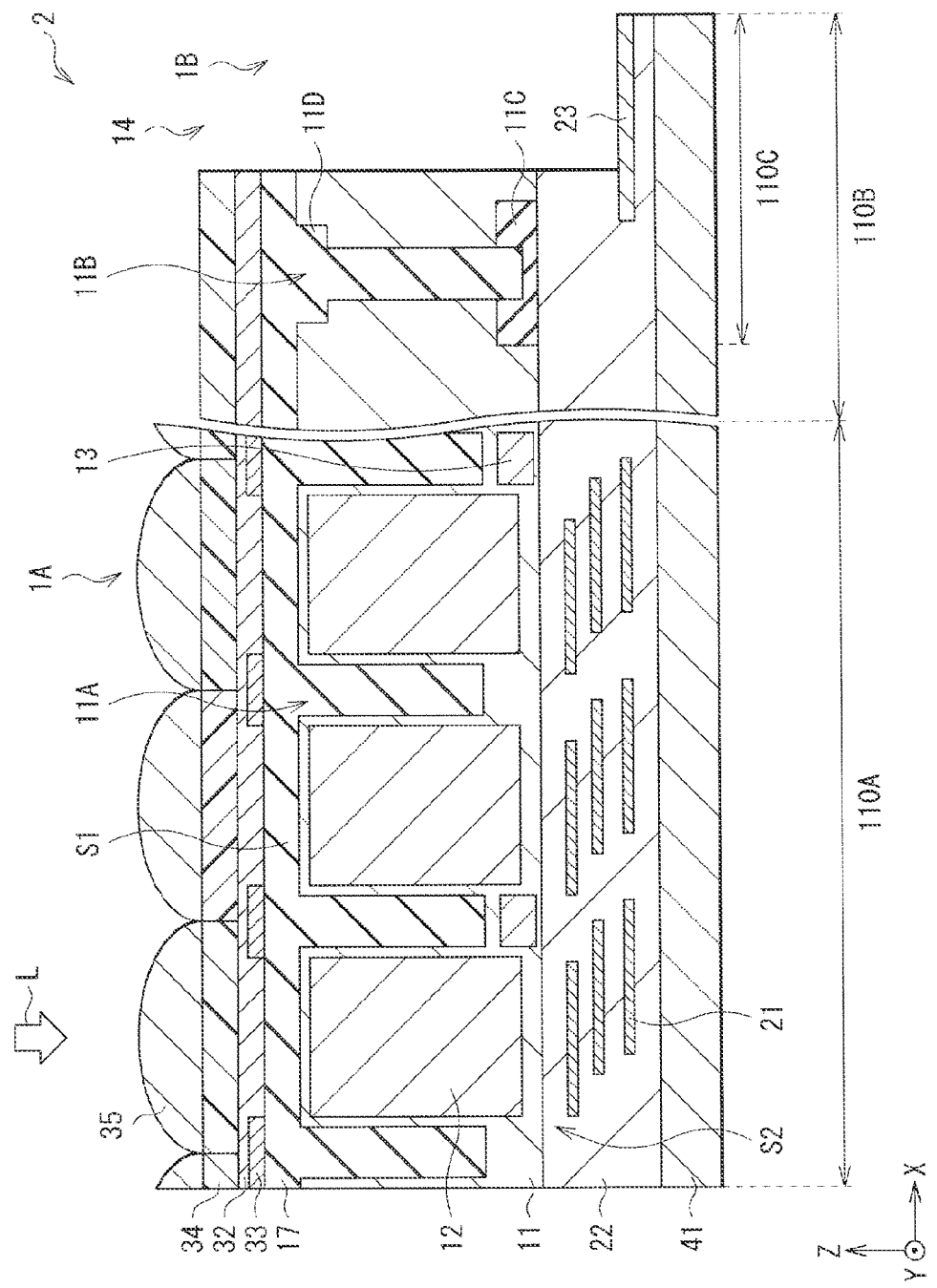
FIG. 9 is a cross-sectional view illustrating an image pickup device according to a second embodiment of the present disclosure.

FIG. 9 illustrates in section a configuration of an image pickup device (an image pickup device 2) according to a second embodiment of the present disclosure. The image pickup device 2 is, similarly to the above-described first embodiment, a backside illumination image pickup device, and has a configuration in which the plurality of pixels P are arranged in a two-dimensional array. The image pickup device 2 according to the embodiment is different from the above embodiment in that the recess 11C and a recess 11D are formed on both of the front surface (the surface S2) and the rear surface (the light-receiving surface S1) at a position where the insulation division trench 11B is formed to insulate the electrode pads 1B from the surroundings in the external connection region 110C of the semiconductor substrate 11.

The image pickup device 2 may be, for example, manufactured as follows.

Figure 10A:
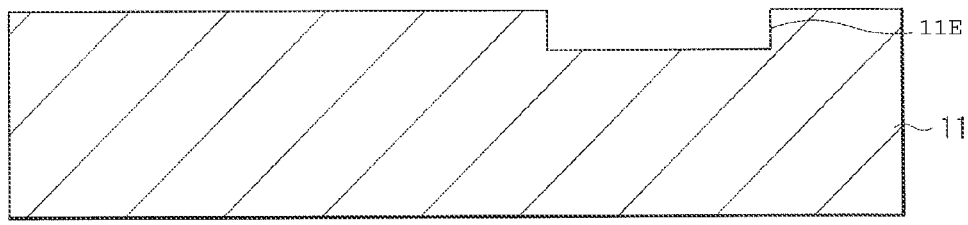
FIGS. 10A-10C are cross-sectional views illustrating a method of manufacturing the image pickup device illustrated in FIG. 9.
Figure 10B:
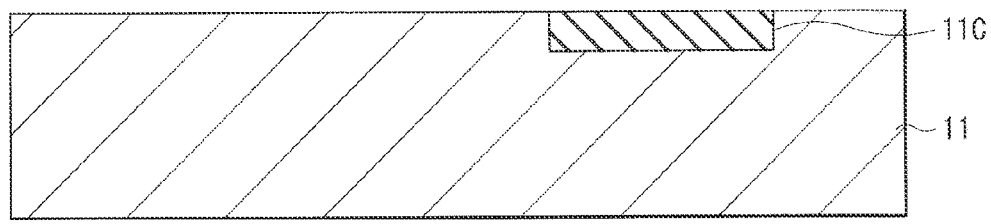
Figure 10C:
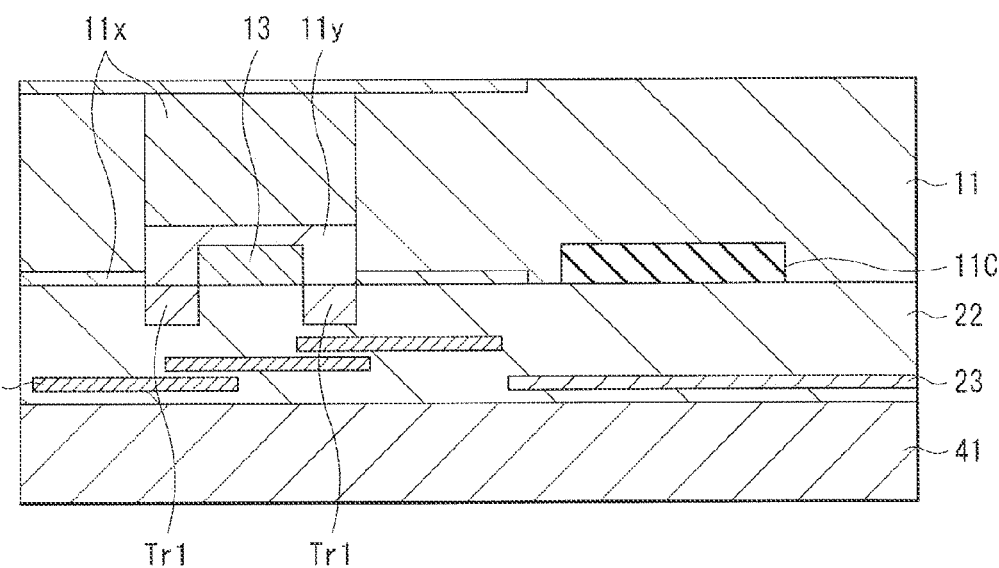

First, as illustrated in FIG. 10A, in the external connection region 110C on the surface S2 of the semiconductor substrate 11, the recess 11E (a first dug portion) is formed, for example, by dry etching to the depth (h) of, for example, 300 nm. After that, as illustrated in FIG. 10B, for example, SiN is embedded by PVD in the recess 11C to form the insulating film 15. Subsequently, similarly to the first embodiment, as illustrated in FIG. 10C, the wiring layer 20 is formed on the surface S2 side of the semiconductor substrate 11, and the impurity semiconductor regions (the n-type semiconductor region that constitutes the PD 12, the p-type layer 11x and the p-well layer 11y) are formed by ion implantation into the semiconductor substrate 11. Next, the support substrate 41 is bonded to the wiring layer 20.

Figure 11A:
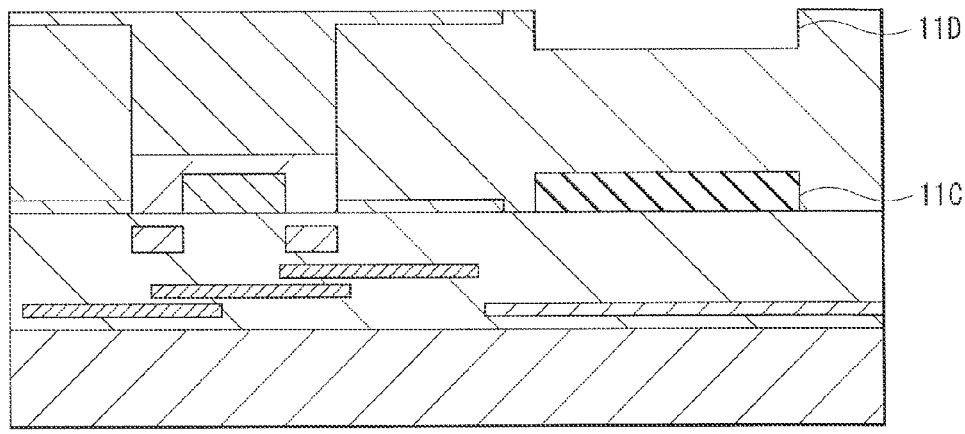
FIGS. 11A-11C are cross-sectional views illustrating a process following FIGS. 10A-10C.
Figure 11B:
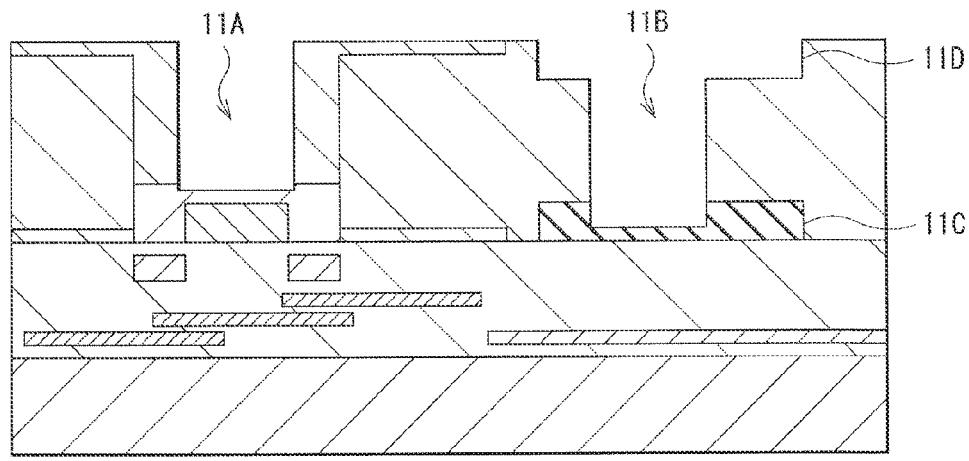

Subsequently, as illustrated in FIG. 11A, the recess 11D (a second dug portion) is formed, for example, by dry etching at a predetermined position of the light-receiving surface S1 of the semiconductor substrate 11, specifically at a position facing the recess 11C provided in the surface S2 of the semiconductor substrate 11. Next, as illustrated in FIG. 11B, the pixel division trench 11A and the insulation division trench 11B are formed to the depth (h) of, for example, 3000 nm between the pixels P and in the recess 11D, respectively, in the semiconductor substrate 11.

Figure 11C:
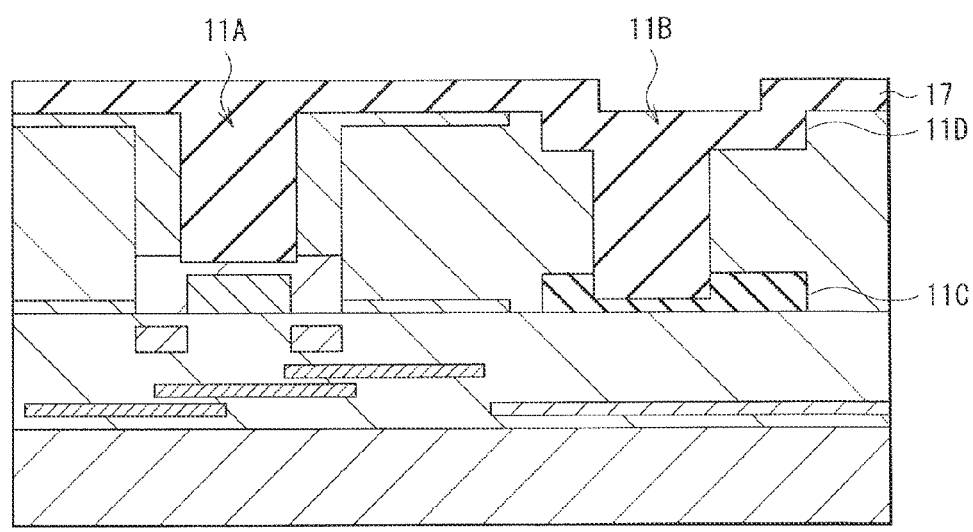

After that, as illustrated in FIG. 11C, on the light-receiving surface S1 side of the semiconductor substrate 11, for example, a $SiO_2$ film is formed by CVD to form the protective film 17. In the meanwhile, the $SiO_2$ film is embedded in the pixel division trench 11A and the insulation division trench 11B. Subsequently, the color filter 34 and the on-chip lens 35 and so on are formed by a method similar to the first embodiment. Thus, the image pickup device 2 is obtained.

In the image pickup device 2 and the manufacturing method thereof according to the embodiment, the thickness of the semiconductor substrate 11 at the insulation division trench 11B formed around the electrode pads 1B is adjusted by forming the recesses 11C and 11D on both of the front surface (the surface S2) and the rear surface (the light-receiving surface S1) of the semiconductor substrate 11. Otherwise, the image pickup device 2 has a similar configuration to the image pickup device 1, and the operations and the effects thereof are also similar.

3. Modification Example 1

Figure 12:
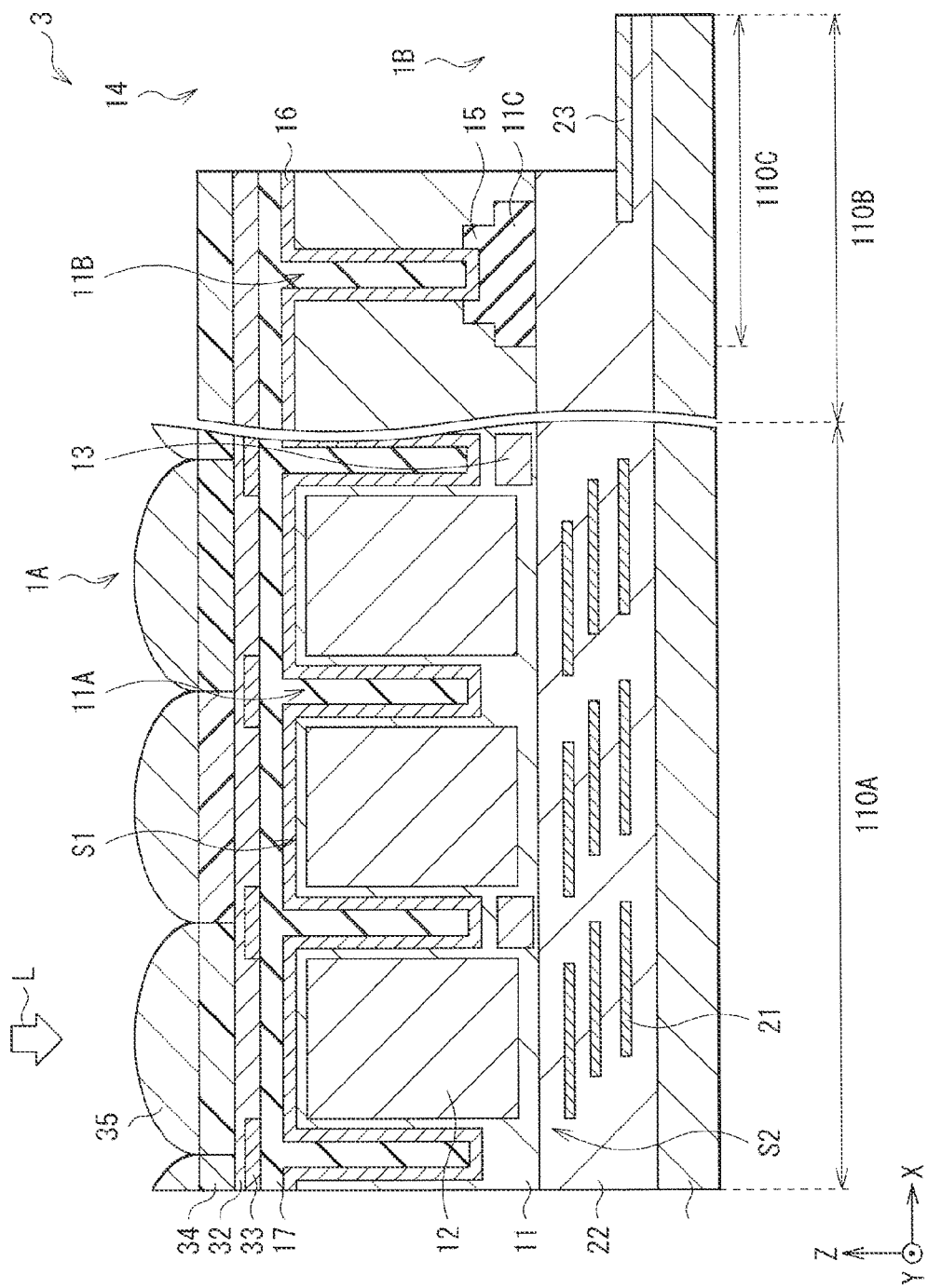
FIG. 12 is a cross-sectional view illustrating one example of an image pickup device according to a modification example 1 of the present disclosure.
Figure 13:
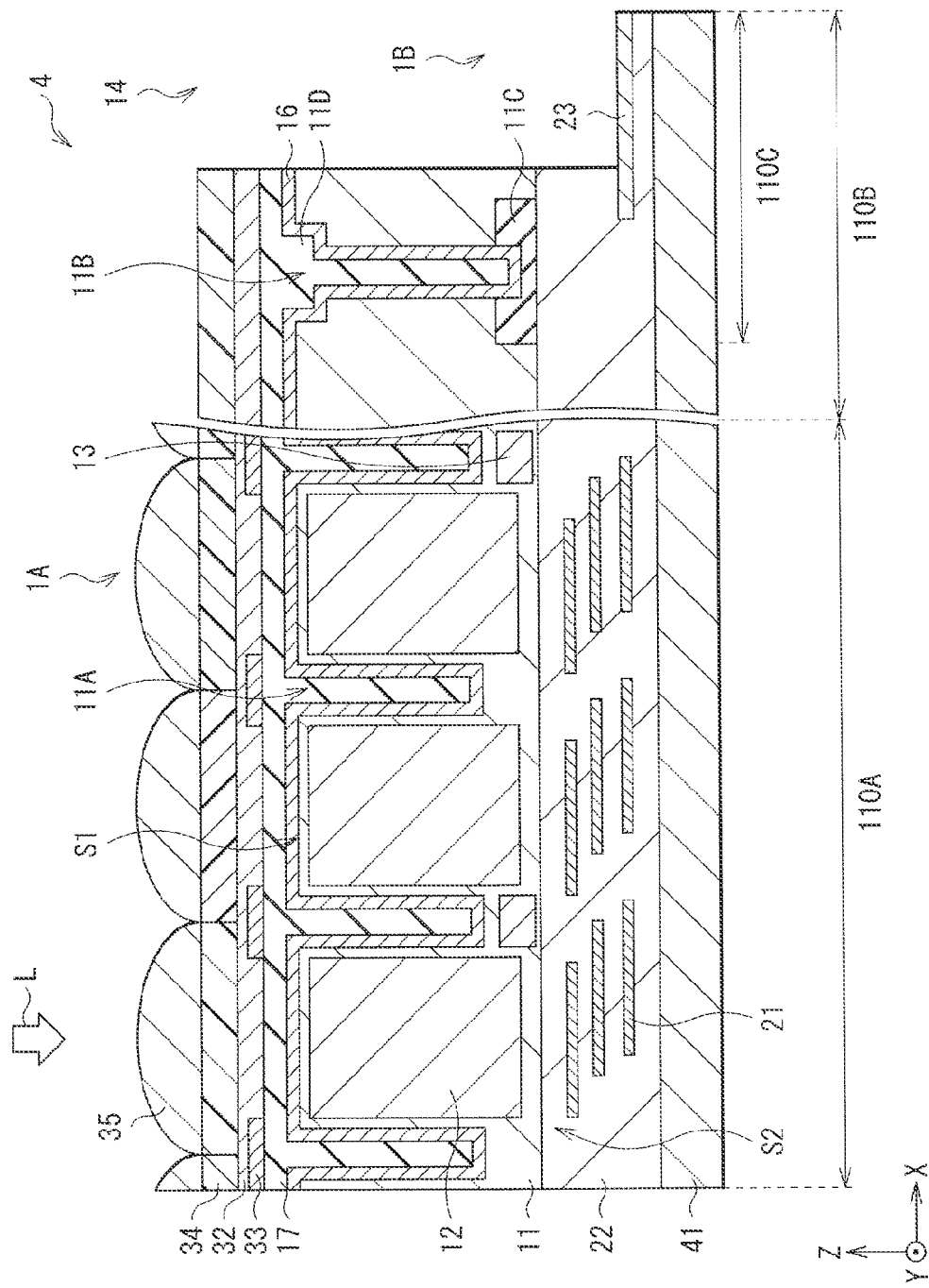
FIG. 13 is a cross-sectional view illustrating another example of an image pickup device according to a modification example 1 of the present disclosure.

FIGS. 12 and 13 illustrate in section configurations of image pickup devices 3 and 4, respectively, according to a modification example 1 of the first and the second embodiments as described above. The image pickup devices 3 and 4 each is, similarly to the above-described first embodiment, a backside illumination image pickup device, and has a configuration in which the plurality of pixels P are arranged in a two-dimensional array. The image pickup devices 3 and 4 according to the modification example are different from the first and the second embodiments in that a fixed charge film 16 is provided on an entire rear surface, which includes the pixel division trench 11A and the insulation division trench 11B, of the semiconductor substrate 11.

The fixed charge film 16 has a negative fixed charge, and is provided on the entire rear surface, which includes the side faces and the bottom faces of the pixel division trench 11A and the insulation division trench 11B, of the semiconductor substrate 11. As a material of the fixed charge film 16, a high-dielectric material having a negative fixed charge may be preferably used. Specific examples include hafnium oxide ($HfO_2$), zirconium oxide ($ZrO_2$), aluminum oxide ($Al_2O_3$), titanium oxide ($TiO_2$), and tantalum oxide ($Ta_2O_5$) and so on. These oxides have results of being used for a gate insulating film of an insulated gate field effect transistor or the like, and deposition methods thereof have been established. Thus, these oxides may be easily deposited. In particular, the use of $HfO_2$ (having a refractive index of 2.05), $Ta_2O_5$ (having a refractive index of 2.16), and $TiO_2$ (having a refractive index of 2.20), which have relatively high refractive indices, may add an anti-reflection effect to the fixed charge film 16. An example of other materials than as described above includes an oxide of a rare earth element. Specifically, an oxide of each of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y). It is to be noted that the above oxides may be doped with silicon (Si) in a certain range without degrading insulation properties. In an alternative, other than oxides, nitrides or oxynitrides such as hafnium nitride, aluminum nitride, hafnium oxynitride, and aluminum oxynitride may be used. Addition of Si or Ni to the fixed charge film 16 contributes to an improvement in heat resisting properties or an ability of preventing ion implantation in manufacturing processes.

As described above, in the modification example, the insulating film (the fixed charge film 16) having a negative charge is formed on the rear surface (the light-receiving surface S1) of the semiconductor substrate 11. Thus, an inversion layer is formed on a surface in contact with the fixed charge film 16. It is therefore possible to obtain an effect that, in addition to the effect of the above-described embodiments, a silicon interface is pinned by the inversion layer, and occurrence of a dark current is restrained. It is also possible to restrain pinning failure due to physical damage that occurs in forming the pixel division trench 11A.

4. Modification Example 2

Figure 14:
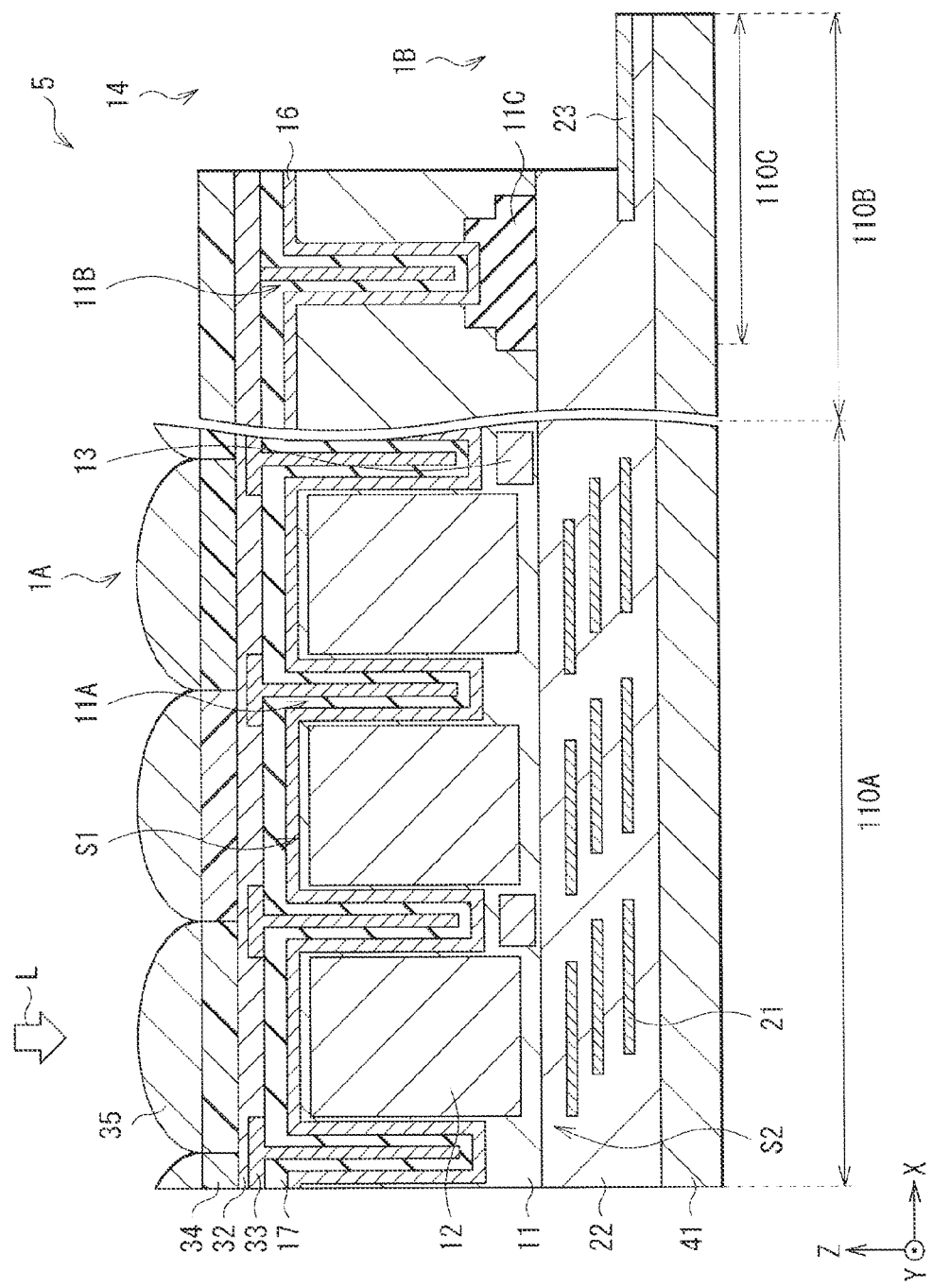
FIG. 14 is a cross-sectional view illustrating one example of an image pickup device according to a modification example 2 of the present disclosure.
Figure 15:
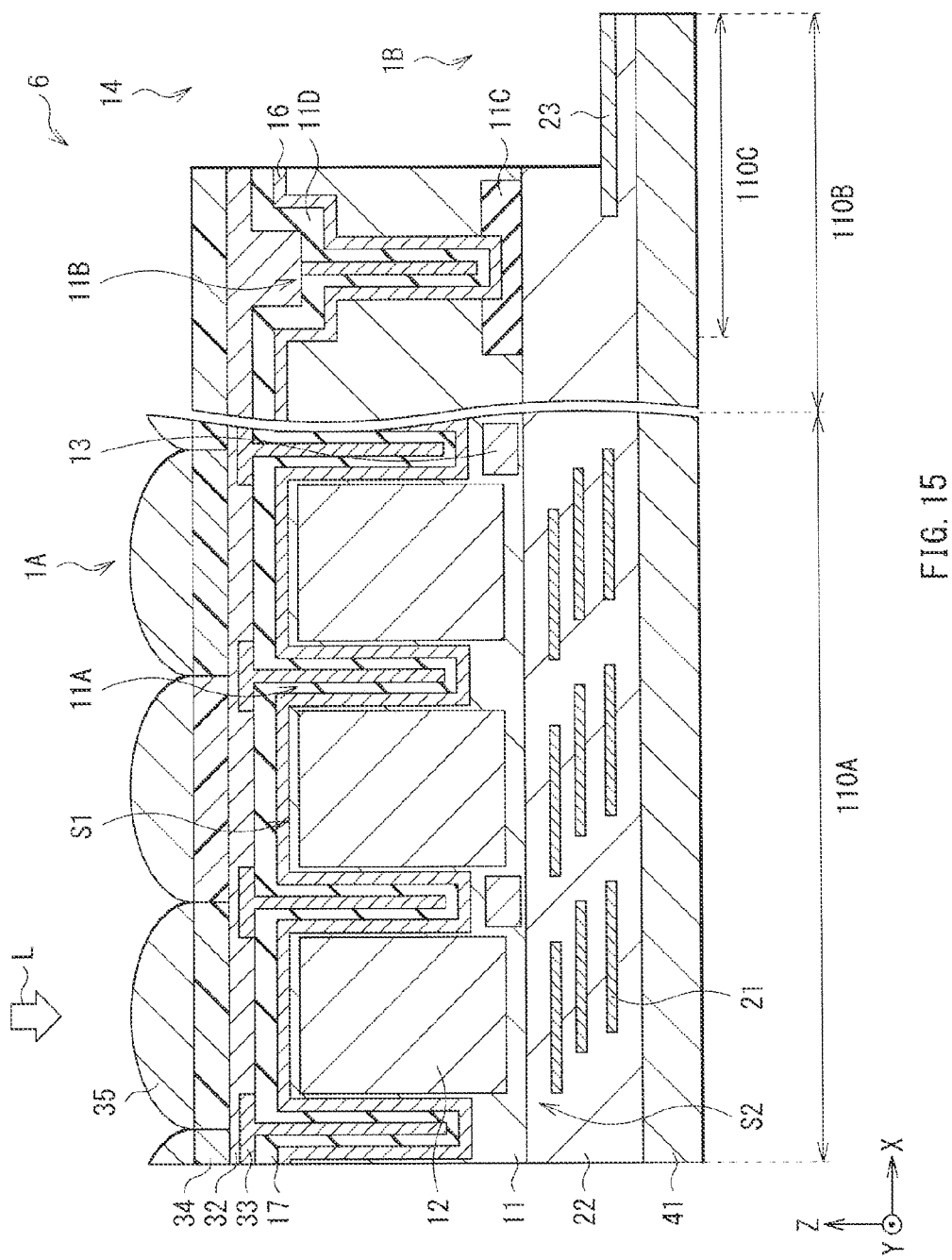
FIG. 15 is a cross-sectional view illustrating another example of an image pickup device according to a modification example 2 of the present disclosure.

FIGS. 14 and 15 illustrate in section configurations of image pickup devices (image pickup devices 5 and 6) according to a modification example 2 of the above-described modification example 1, respectively. The image pickup devices 5 and 6 each is, similarly to the above-described first embodiment and so forth, a backside illumination image pickup device, and has a configuration in which the plurality of pixels P are arranged in a two-dimensional array. The image pickup devices 5 and 6 according to the modification example are different from the modification example 1 in that the light-shielding film 33 is extended in the pixel division trench 11A and the insulation division trench 11B.

As described above, in the modification example, the light-shielding film 33 is extended in the pixel division trench 11A and the insulation division trench 11B. It is therefore possible to obtain an effect that, in addition to the effects of the above-described modification example, occurrence of optical color mixing between the adjacent pixels P is restrained.

It is to be noted that the modification example may also be applied to the above-described first and second embodiments. In other words, it is possible to obtain the same effect as the modification example by extending the light-shielding film 33 in the pixel division trench 11A and the insulating division trench 11B without providing the fixed charge film 16 in them.

5. Modification Example 3

Figure 16A:
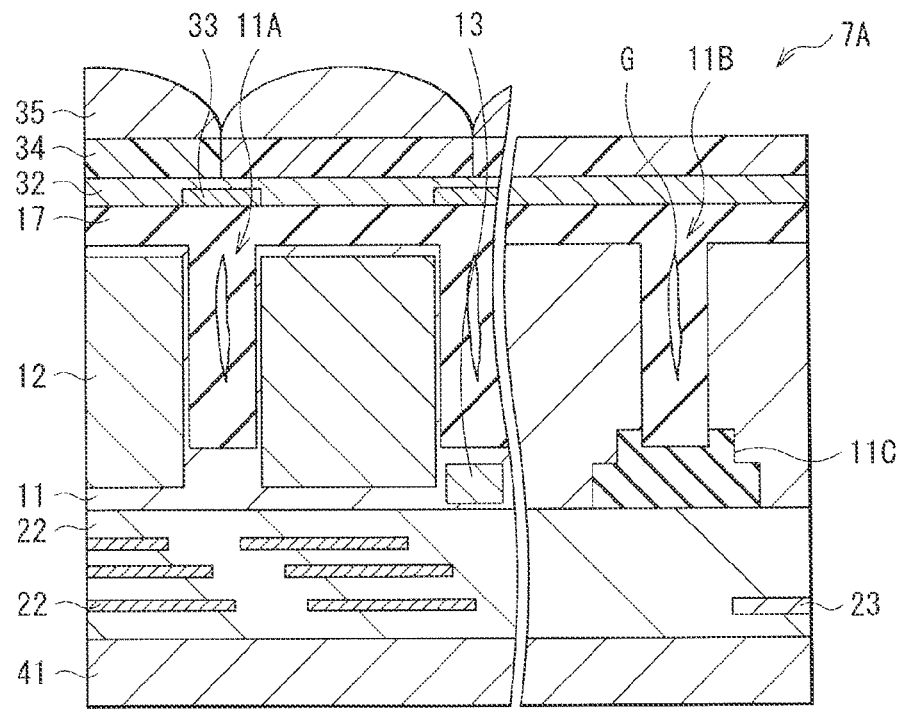
FIG. 16A is a cross-sectional view illustrating one example of an image pickup device according to a modification example 3 of the present disclosure.
Figure 16B:
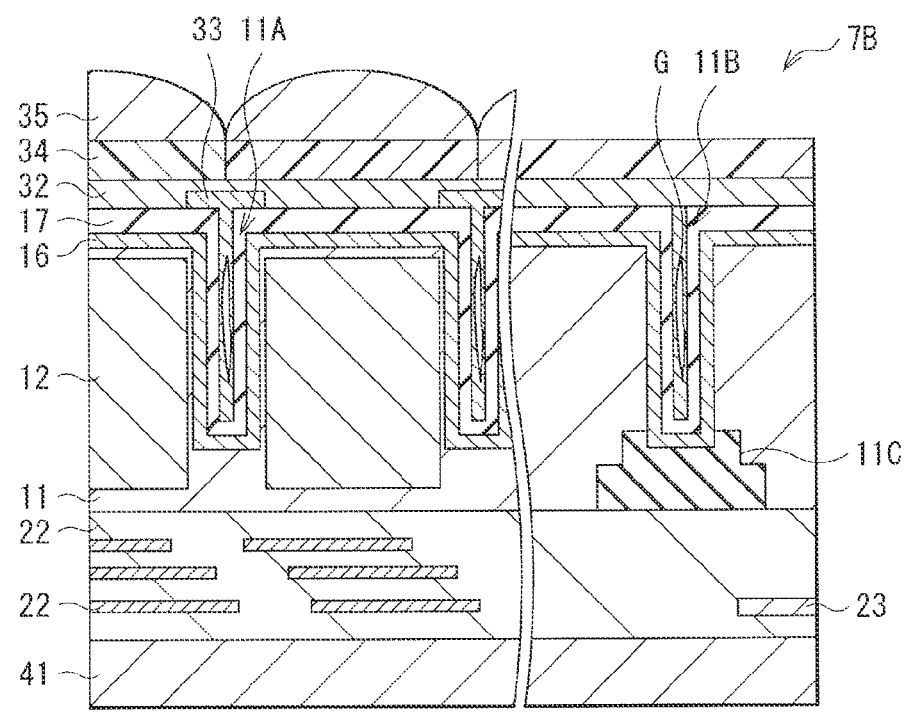
FIG. 16B is a cross-sectional view illustrating another example of an image pickup device according to a modification example 3 of the present disclosure.

FIGS. 16A and 16B illustrate in section configurations of image pickup devices 7A and 7B according to a modification example 3. The image pickup devices 1 to 6 according to the above-described embodiments and so forth may further include an air gap G in the pixel division trench 11A and the insulation division trench 11B. The air gap G in the pixel division trench 11A and the insulation division trench 11B may be formed by CVD (Chemical Vapor Deposition) at high deposition speed or by sputtering.

As described above, it is possible to obtain an effect that, in addition to the effect of the above-described embodiments and so forth, by providing the air gap G in each of the trenches, a difference in the refractive indices increases, and a higher reflection function is obtained.

6. Modification Example 4

Figure 17:
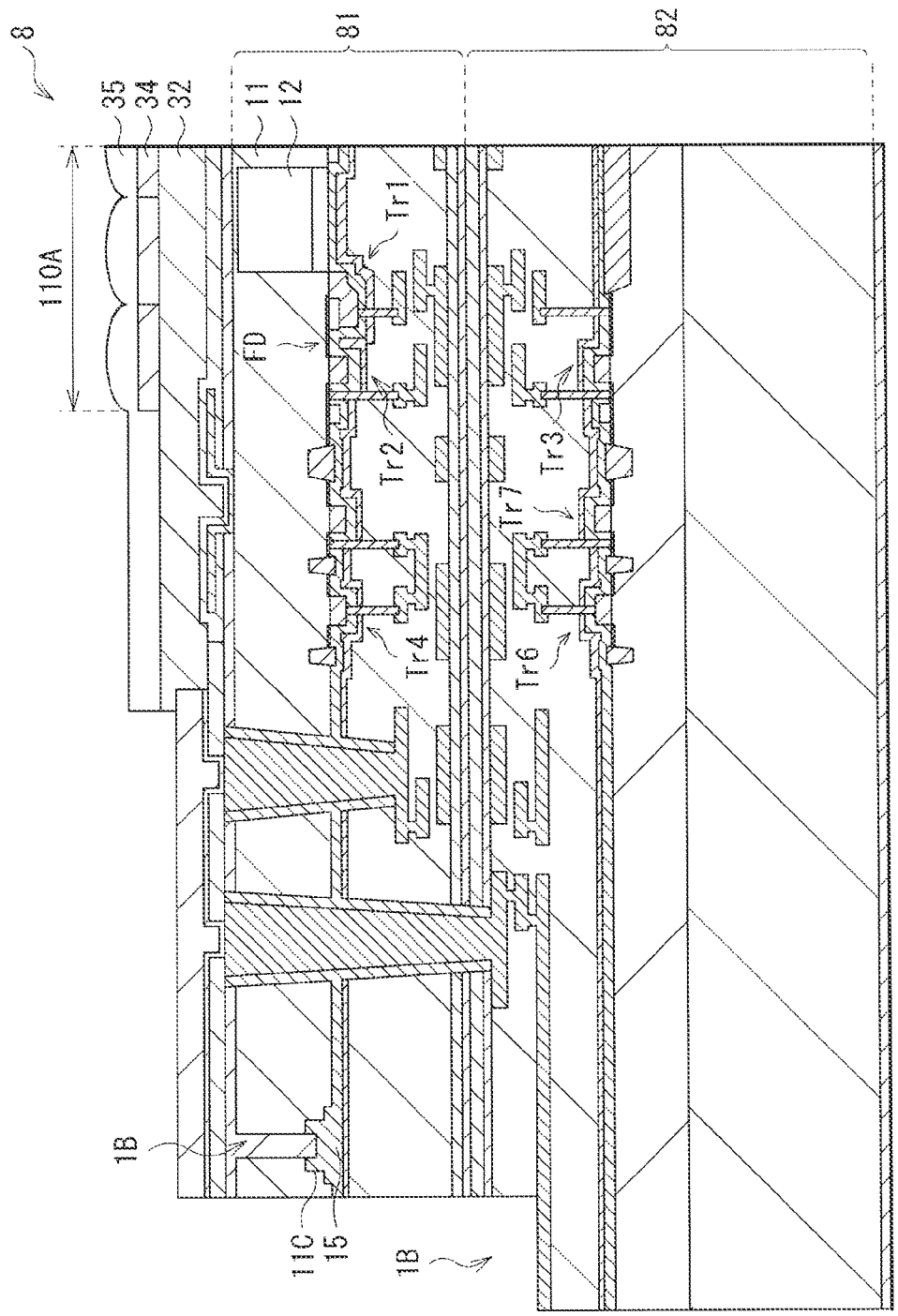
FIG. 17 is a cross-sectional view illustrating an image pickup device according to a modification example 4 of the present disclosure.

FIG. 17 illustrates in section a configuration of an image pickup device 8 according to a modification example 4 in the above-described first embodiment and so forth. The image pickup device 8 according to the modification example is, similarly to the above-described embodiments and so forth, a backside illumination image pickup device. The image pickup device 8 is an image pickup device of a layered type in which a first semiconductor chip 81 and a second semiconductor chip 82 are electrically connected to each other to constitute one semiconductor chip. The first semiconductor chip 81 is loaded with the light-receiving region 110A and a control circuit. The second semiconductor chip 82 is loaded with a logic circuit including a signal processing circuit. The embodiments of the present technology may be applicable to such an image pickup device of a layered type, as illustrated in FIG. 17.

7. Application Example

Figure 18:
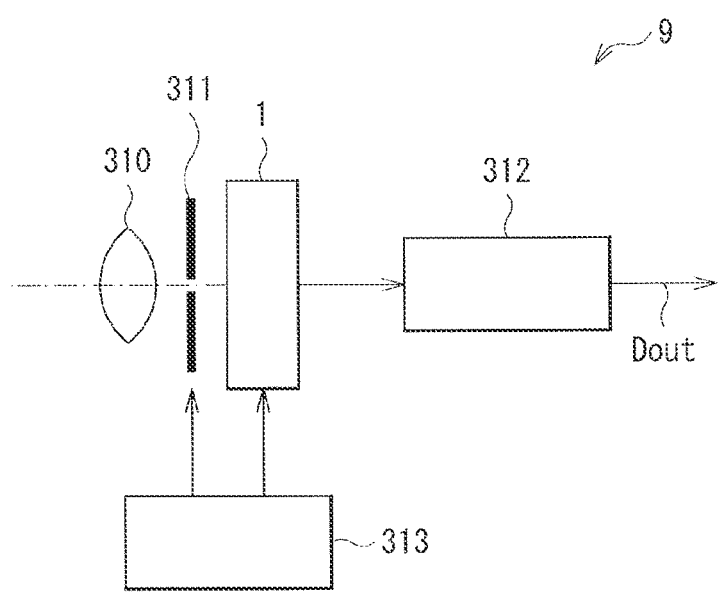
FIG. 18 is a functional block diagram of an electronic apparatus according to an application example.

The image pickup devices 1 to 8 according to the first and the second embodiments and the modification examples 1 to 4 as described above may be loaded on an electronic apparatus having a photographing function in various types, for example, a camera system such as a digital still camera or a video camera, and a mobile phone, and so on. FIG. 18 illustrates as an example an overall configuration of a camera (an electronic apparatus). The electronic apparatus 9 is a video camera capable of taking, for example, still images or moving pictures. The electronic apparatus 9 includes an image pickup device (for example, the image pickup device 1), an optical system (an optical lens) 310, a shutter device 311, a signal processing section 312, and a drive section 313.

The optical system 310 is configured to guide image light (incident light) from an object to be photographed toward the pixel region 1a of the image pickup device 1. The optical system 310 may include a plurality of optical lenses. The shutter device 311 is configured to control a light-irradiation period and a light-shielding period with respect to the image pickup device 1. The drive section 313 is configured to control a shutter operation of the shutter device 311 and a transfer operation of the image pickup device 1. The signal processing section 312 is configured to perform various kinds of signal processing on a signal output from the image pickup device 1. A picture signal Dout after signal processing may be, for example, stored in a recording medium such as a memory, or output to a monitor or the like.

Although description has been made by giving the first and the second embodiments and the modification examples 1 to 4, the contents of the present technology are not limited to the above-mentioned embodiments and so forth and may be modified in a variety of ways. For example, although a case that the PD 12 is formed on the rear surface (the light-incident surface) side of the semiconductor substrate 11 has been exemplified in the above-mentioned embodiments and so forth, the PD 12 may be provided on the front surface side of the semiconductor substrate 11, that is, between the semiconductor substrate 11 and the wiring layer 20. It is to be noted that also in this case a second region 12B having a wide forbidden band width may be preferably provided on the light incident surface side.

Further, an inner lens (not illustrated) may be provided between the light-receiving section 10 and the color filter 34 of the focusing section 30.

In addition, it is not necessary to include all the constitutional elements described in the above-mentioned embodiments and so forth, and rather an element or elements other than the above-mentioned elements may be also included.

It is to be noted that the effects described in this specification are merely exemplified and not limitative, and other effects may be shown.

It is possible to achieve at least the following configurations from the above-described example embodiments of the disclosure.

(1) An image pickup device, including:
a first trench provided between a plurality of pixels in a light-receiving region of a semiconductor substrate, the semiconductor substrate including the light-receiving region and a peripheral region, the light-receiving region being provided with the plurality of pixels each including a photoelectric conversion section; and
a second trench provided in the peripheral region of the semiconductor substrate,
wherein the semiconductor substrate has a variation in thickness between a portion where the first trench is provided and a portion where the second trench is provided.
(2) The image pickup device according to (1), wherein, in the semiconductor substrate, a thickness of the portion where the second trench is provided is smaller than a thickness of the portion where the first trench is provided.
(3) The image pickup device according to (1) or (2), further including a dug portion, the dug portion provided in a region of one or both surfaces of the semiconductor substrate, the region facing the second trench.
(4) The image pickup device according to any one of (1) to (3), wherein the first trench separates the photoelectric conversion section for each of the plurality of pixels.
(5) The image pickup device according to any one of (1) to (4), further including an external connection electrode that is provided in the peripheral region,
wherein the second trench is provided around the external connection electrode.
(6) The image pickup device according to any one of (3) to (5), wherein the dug portion is filled with an insulating material.
(7) The image pickup device according to any one of (1) to (6), wherein the second trench penetrates the semiconductor substrate.
(8) A method of manufacturing an image pickup device, the method including:
providing a dug portion in a peripheral region in one surface of a semiconductor substrate, the semiconductor substrate including a light-receiving region and the peripheral region, the light-receiving region being provided with a plurality of pixels each including a photoelectric conversion section; and
providing a first trench and a second trench in another surface of the semiconductor substrate, the first trench being provided in the light-receiving region, the second trench being provided at a position of the peripheral region, the position facing the dug portion.
(9) The method of manufacturing the image pickup device according to (8), wherein the dug portion is formed by two-stage etching.
(10) The method of manufacturing the image pickup device according to (8) or (9), further including, after providing the dug portion as a first dug portion, providing a second dug portion, the second dug portion being provided at a position in the another surface of the semiconductor substrate, the position facing the first dug portion.
(11) The method of manufacturing the image pickup device according to (9) or (10), further including embedding an insulating material in the dug portion.
(12) An electronic apparatus provided with an image pickup device, the image pickup device including:
a first trench provided between a plurality of pixels in a light-receiving region of a semiconductor substrate, the semiconductor substrate including the light-receiving region and a peripheral region, the light-receiving region being provided with the plurality of pixels each including a photoelectric conversion section; and
a second trench provided in the peripheral region of the semiconductor substrate,
wherein the semiconductor substrate has a variation in thickness between a portion where the first trench is provided and a portion where the second trench is provided.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a first semiconductor section including a first semiconductor substrate and a first wiring layer provided at a first side of the first semiconductor substrate that is opposite to a light-incident side of the first semiconductor substrate, the first semiconductor substrate including:
a light-receiving region including a plurality of photoelectric conversion regions,
a peripheral region,
an insulating film at the first side of the first semiconductor substrate,
a first trench including a fixed charge film adjacent to at least one photoelectric conversion region of the plurality of photoelectric conversion regions, and
a second trench located in the peripheral region, wherein the second trench is in contact with the insulating film at the first side of the first semiconductor substrate; and
a second semiconductor section electrically connected to the first semiconductor section and including at least a portion of a logic circuit, the second semiconductor section being attached to the first side of the first semiconductor section such that the first semiconductor section is above the second semiconductor section.

2. The imaging device according to claim 1, wherein a thickness of the first semiconductor substrate where the second trench is located is less than a thickness of the first semiconductor substrate where the first trench is located.

3. The imaging device according to claim 1, further comprising a recess portion, wherein the recess portion is located in a region of one or both surfaces of the first semiconductor substrate, and wherein the region faces the second trench.

4. The imaging device according to claim 1, wherein the first trench separates each photoelectric conversion region of the plurality of photoelectric conversion regions.

5. The imaging device according to claim 1, further comprising an external connection electrode that is provided in the peripheral region, wherein the second trench is provided around the external connection electrode.

6. The imaging device according to claim 3, wherein the recess portion is filled with an insulating material.

7. The imaging device according to claim 1, wherein the second trench penetrates the first semiconductor substrate.

8. A method of manufacturing an imaging device, the method comprising:
   forming a first semiconductor section including a first semiconductor substrate and a first wiring layer at a first side of the first semiconductor substrate that is opposite to a light-incident side of the first semiconductor substrate, the first semiconductor substrate including a light-receiving region and a peripheral region, the light-receiving region including a plurality of photoelectric conversion regions;
   forming a first trench adjacent to at least one photoelectric conversion region of the plurality of photoelectric conversion regions in the light-receiving region of the first semiconductor substrate;
   forming a fixed charge film within the first trench;
   forming a second trench in the peripheral region of the first semiconductor substrate, wherein the second trench is in contact with an insulating film provided at the first side of the first semiconductor substrate; and
   forming a second semiconductor section including at least a portion of a logic circuit, wherein the second semiconductor section is electrically connected to the first semiconductor section and the second semiconductor section is attached to the first side of the first semiconductor section such that the first semiconductor section is above the second semiconductor section; and
   attaching the second semiconductor section to the first semiconductor section.

9. The method of manufacturing the imaging device according to claim 8, further including:
   forming a recess portion located in a surface of the first semiconductor substrate, wherein the recess portion is formed by two-stage etching.

10. The method of manufacturing the imaging device according to claim 9, further including:
    forming a second recess portion, the second recess portion being located in another surface of the first semiconductor substrate and facing the recess portion.

11. The method of manufacturing the imaging device according to claim 9, further comprising embedding an insulating material in the recess portion.

12. An electronic apparatus provided with an imaging device, the imaging device comprising:
    a first semiconductor section including a first semiconductor substrate that is opposite to a light-incident side of the first semiconductor substrate and a first wiring layer provided at a first side of the first semiconductor substrate, the first semiconductor substrate including:
      a light-receiving region including a plurality of photoelectric conversion regions,
      a peripheral region,
      an insulating film at the first side of the first semiconductor substrate,
      a first trench including a fixed charge film adjacent to at least one photoelectric conversion region of the plurality of photoelectric conversion regions, and
      a second trench located in the peripheral region, wherein the second trench is in contact with the insulating film at the first side of the first semiconductor substrate; and
    a second semiconductor section electrically connected to the first semiconductor section and including at least a portion of a logic circuit, the second semiconductor section being attached to the first side of the first semiconductor section such that the first semiconductor section is above the second semiconductor section.

13. The imaging device according to claim 1, wherein the second trench is filled with a first material.

14. The imaging device according to claim 13, further comprising a recess portion, wherein the recess portion is located in a region of one or both surfaces of the first semiconductor substrate and is filled with a second material, and wherein the first material is different from the second material.

15. The electronic apparatus according to claim 12, wherein a thickness of the first semiconductor substrate where the second trench is provided is less than a thickness of the first semiconductor substrate where the first trench is provided.

16. The electronic apparatus according to claim 12, further comprising a recess portion, wherein the recess portion is located in a region of one or both surfaces of the first semiconductor substrate, and wherein the region faces the second trench.

17. The electronic apparatus according to claim 16, wherein the recess portion is filled with an insulating material.

18. The electronic apparatus according to claim 12, wherein the first trench separates each photoelectric conversion region of the plurality of photoelectric conversion regions.

19. The electronic apparatus according to claim 12, further comprising an external connection electrode that is provided in the peripheral region, wherein the second trench is provided around the external connection electrode.

20. The electronic apparatus according to claim 12, wherein the second trench penetrates the first semiconductor substrate.

\* \* \* \* \*